US012785690B2

(12) United States Patent
Kang

(10) Patent No.: US 12,785,690 B2
(45) Date of Patent: Nov. 3, 2026

(54) BUFFER CIRCUIT, CLOCK GENERATING CIRCUIT, SEMICONDUCTOR APPARATUS AND SEMICONDUCTOR SYSTEM USING THE SAME

(71) Applicant: SK hynix Inc., Icheon-si (KR)

(72) Inventor: Ji Hyo Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 288 days.

(21) Appl. No.: 18/495,592

(22) Filed: Oct. 26, 2023

(65) Prior Publication Data

US 2024/0356550 A1 Oct. 24, 2024

(30) Foreign Application Priority Data

Apr. 24, 2023 (KR) ........................ 10-2023-0053381

(51) Int. Cl.
*H03K 19/017* (2006.01)
*G11C 7/10* (2006.01)

(52) U.S. Cl.
CPC ..... *H03K 19/01742* (2013.01); *G11C 7/1057* (2013.01); *G11C 7/1084* (2013.01)

(58) Field of Classification Search
CPC ................................................ H03K 19/01742
USPC .......................................... 327/333, 108–112
See application file for complete search history.

(56) References Cited

U.S. PATENT DOCUMENTS 6,668,031 B1 * 12/2003 Hanson ................ G11C 7/1078 327/141
7,586,339 B2 * 9/2009 Oh ....................... G11C 7/1057 326/82
8,350,603 B2 1/2013 Chen

FOREIGN PATENT DOCUMENTS

KR 100703311 B1 4/2007

* cited by examiner

*Primary Examiner* — Tomi Skibinski
(74) *Attorney, Agent, or Firm* — WILLIAM PARK AND ASSOCIATES LTD.

(57) ABSTRACT

A buffer circuit includes a driving control circuit and a driving circuit. The driving control circuit changes a voltage level of an input signal to generate a pull-up control signal and a pull-down control signal. The pull-up control signal has a voltage level lower than a high boundary voltage level of the input signal. The pull-down control signal has a voltage level higher than a low boundary voltage level of the input signal. The driving circuit generates an output signal based on the pull-up control signal and the pull-down control signal.

14 Claims, 12 Drawing Sheets

BUFFER CIRCUIT, CLOCK GENERATING CIRCUIT, SEMICONDUCTOR APPARATUS AND SEMICONDUCTOR SYSTEM USING THE SAME

CROSS-REFERENCES TO RELATED APPLICATION

The present application claims priority under 35 U.S.C. § 119 (a) to Korean application number 10-2023-0053381, filed on Apr. 24, 2023, in the Korean Intellectual Property Office, which is incorporated herein by reference in its entirety as set forth in full.

BACKGROUND

1. Technical Field

Various embodiments generally relate to integrated circuit technology, and more specifically, to a buffer circuit and a clock generating circuit, a semiconductor apparatus and a semiconductor system utilizing the buffer circuit.

2. Related Art

Electronic devices contain numerous electronic components, and among them, a computer system may include many semiconductor apparatuses. The semiconductor apparatuses that make up the computer system may communicate with each other by transmitting and receiving clock signals and data. The semiconductor apparatuses may transmit and/or receive a system clock signal with other semiconductor apparatuses and may be synchronized to the system clock signal to transmit and receive data. As the operating frequency of the computer system increases, the frequency of a signal used between the semiconductor apparatuses or internally within the respective semiconductor apparatuses is increasing while the amplitude of the signal is decreasing. The semiconductor apparatuses may be equipped with buffer circuits to process the high-frequency signals. The operational performance of the buffer circuits may be a critical factor in determining the operational speed and the reliability of the semiconductor apparatuses.

SUMMARY

In an embodiment, a buffer circuit may include a driving control circuit and a driving circuit. The driving control circuit may be configured to receive an input signal, configured to change a voltage level of a first node to a voltage level lower by a first voltage level lower than a high boundary voltage level of the input signal and configured to change a voltage level of a second node to a voltage level higher by a second voltage level higher than a low boundary voltage level of the input signal. The driving circuit may be configured to pull-up drive an output node based on the voltage level of the first node and configured to pull-down drive the output node based on the voltage level of the second node.

In an embodiment, a buffer circuit may include a driving control circuit and a driving circuit. The driving control circuit may be configured to receive an input signal swinging between a high boundary voltage level and a low boundary voltage level and configured to convert the swing range of the input signal to generate a pull-up control signal swinging within a first swing range and a pull-down control signal swinging within a second swing range. The driving circuit may be configured to pull-up drive an output node based on the pull-up control signal and configured to pull-down drive the output node based on the pull-down control signal.

In an embodiment, a buffer circuit may include a driving control circuit and a driving circuit. The driving control circuit may be configured to receive an input signal and configured to generate, when a first control signal is enabled, a pull-up control signal having a voltage level lower than a high boundary voltage level of the input signal and a pull-down control signal having a voltage level higher than a low boundary voltage level of the input signal. The driving circuit may be configured to pull-up drive an output node based on the pull-up control signal and configured to pull-down drive the output node based on the pull-down control signal.

In an embodiment, a buffer circuit may include a first driving control circuit, a first driving circuit, a second driving control circuit and a second driving circuit. The first driving control circuit may be configured to change, when a first control signal is enabled, a voltage level of a first input signal to generate a first pull-up control signal and a first pull-down control signal. The first driving circuit may be configured to pull-up drive a first output signal based on the first pull-up control signal and configured to pull-down drive the first output signal based on the first pull-down control signal. The second driving control circuit may be configured to change, when the first control signal is enabled, a voltage level of a second input signal to generate a second pull-up control signal and a second pull-down control signal. The second driving circuit may be configured to pull-up drive a second output signal based on the second pull-up control signal and configured to pull-down drive the second output signal based on the second pull-down control signal.

In an embodiment, a buffer circuit may include a first driving control circuit, a second driving control circuit and a driving circuit. The first driving control circuit may be configured to receive a first input signal and configured to change, based on a first selection signal, a voltage level of the first input signal to generate a pull-up control signal and a pull-down control signal. The second driving control circuit may be configured to receive a second input signal and configured to change, based on a second selection signal, a voltage level of the second input signal to generate the pull-up control signal and the pull-down control signal. The driving circuit may be configured to pull-up drive an output signal based on the pull-up control signal and configured to pull-down drive the output signal based on the pull-down control signal.

In an embodiment, a buffer circuit may include a first N-channel MOS transistor, a first P-channel MOS transistor, a second P-channel MOS transistor and a second N-channel MOS transistor. The first N-channel MOS transistor may be configured to receive a first control signal through a gate thereof and configured to receive an input signal through one of source and drain thereof and connected to a first node through the other of the source and the drain thereof. The first P-channel MOS transistor may be configured to receive a complementary signal of the first control signal through a gate thereof and configured to receive the input signal through one of source and drain thereof and connected to a second node through the other of the source and the drain thereof. The second P-channel MOS transistor may be configured to pull-up drive an output node based on a voltage level of the first node. The second N-channel MOS transistor may be configured to pull-down drive the output node based on a voltage level of the second node.

DETAILED DESCRIPTION

Figure 1:
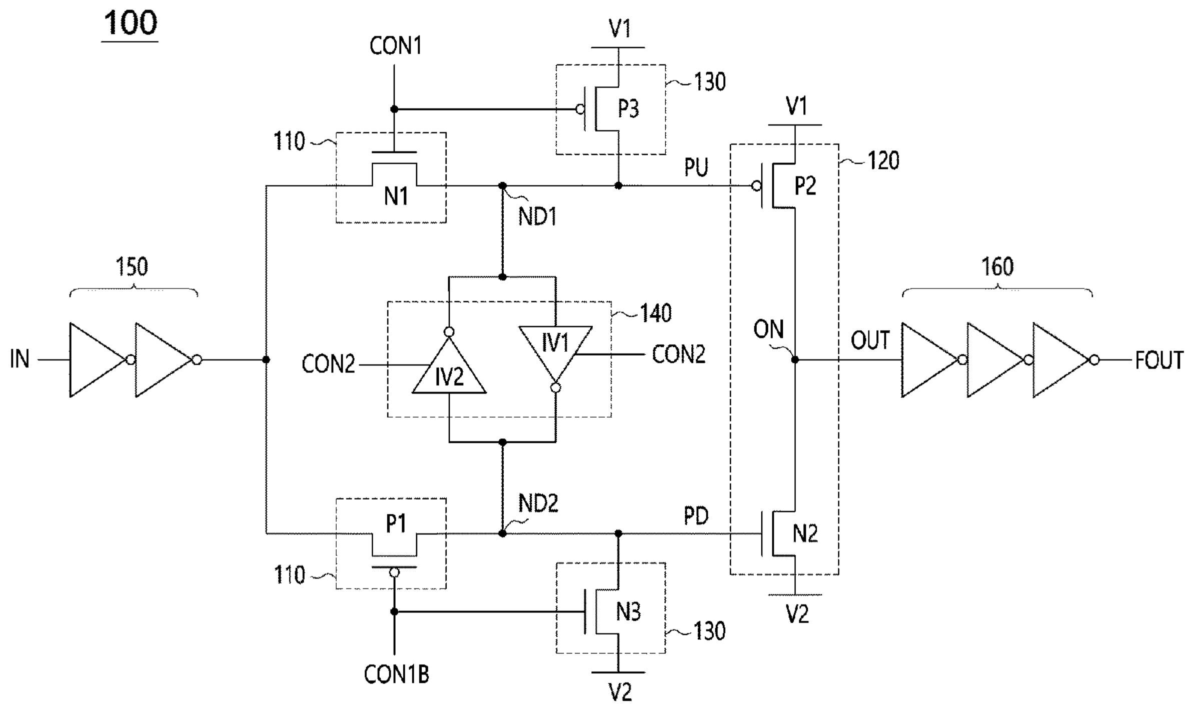
FIG. 1 is a diagram illustrating a configuration of a buffer circuit in accordance with an embodiment.

FIG. 1 is a diagram illustrating a configuration of a buffer circuit 100 in accordance with an embodiment. Referring to FIG. 1, the buffer circuit 100 may receive an input signal IN to generate an output signal OUT. The buffer circuit 100 may buffer the input signal IN to generate the output signal OUT. The buffer circuit 100 may change a voltage level of the input signal IN to perform a buffering operation. For example, the input signal IN may swing between a high boundary voltage level and a low boundary voltage level. The buffer circuit 100 may reduce the swing range of the input signal IN and may perform, based on a signal having the reduced swing range, a buffering operation to generate the output signal OUT. The buffer circuit 100 may receive a first control signal CON1 and may buffer the input signal IN when the first control signal CON1 is enabled.

The buffer circuit 100 may include a driving control circuit 110 and a driving circuit 120. The driving control circuit 110 may receive the input signal IN and may change the voltage level of the input signal IN to generate a pull-up control signal PU and a pull-down control signal PD. The driving control circuit 110 may output the pull-up control signal PU through a first node ND1 and the pull-down control signal PD through a second node ND2. The buffer circuit 100 may reduce the swing range of the input signal IN and may generate the pull-up control signal PU and the pull-down control signal PD, which have the reduced swing range. The driving control circuit 110 may generate the pull-up control signal PU having a lower voltage level than the high boundary voltage level of the input signal IN. The driving control circuit 110 may generate the pull-down control signal PD having a higher voltage level than the low boundary voltage level of the input signal IN. The driving control circuit 110 may change the voltage level of the first node ND1 to a voltage level lower by a first voltage level than the high boundary voltage level of the input signal IN. The driving control circuit 110 may change the voltage level of the second node ND2 to a voltage level higher by a second voltage level than the low boundary voltage level of the input signal IN. The first voltage level may be the same as or different from the second voltage level. The first voltage level may vary as far as the driving circuit 120 is able to determine, as a high logic level, the voltage level of the first node ND1 lower by the first voltage level than the high boundary voltage level. The second voltage level may vary as far as the driving circuit 120 is able to determine, as a low logic level, the voltage level of the second node ND2 higher by the second voltage level than the low boundary voltage level. The driving control circuit 110 may change the swing range of the input signal IN to generate the pull-up control signal PU having a first swing range and the pull-down control signal PD having a second swing range. Each of the first swing range and the second swing range may be smaller than the swing range of the input signal IN. The first swing range may be between a voltage level, which is lower by the first voltage level than the high boundary voltage level, and the low boundary voltage level. The second swing range may be between the high boundary voltage level and a voltage level, which is higher by the second voltage level than the low boundary voltage level.

The driving control circuit 110 may further receive a first control signal CON1. The first control signal CON1 may be to activate or deactivate the buffer circuit 100. Based on the first control signal CON1, the driving control circuit 110 may generate the pull-up control signal PU and the pull-down control signal PD from the input signal IN. When the first control signal CON1 is enabled, the driving control circuit 110 may change the voltage level of the first node ND1 to a voltage level lower than the input signal IN to generate the pull-up control signal PU and may change the voltage level of the second node ND2 to a voltage level higher than the input signal IN to generate the pull-down control signal PD. When the first control signal CON1 is disabled, the driving control circuit 110 might not generate, from the input signal IN, the voltage levels of the first node ND1 and the second node ND2 and might not generate the pull-up control signal PU and the pull-down control signal PD.

The driving circuit 120 may be connected to the first node ND1 to receive the pull-up control signal PU from the driving control circuit 110 and may be connected to the second node ND2 to receive the pull-down control signal PD from the driving control circuit 110. The driving circuit 120 may change a voltage level of the output node ON based on the voltage levels of the first node ND1 and the second node ND2 and/or the pull-up control signal PU and the pull-down control signal PD. The output signal OUT may be generated through the output node ON. The driving circuit 120 may pull-up drive the output node ON based on the voltage level of the first node ND1 and/or the pull-up control signal PU. The driving circuit 120 may pull-down drive the output node ON based on the voltage level of the second node ND2 and/or the pull-down control signal PD. The driving circuit 120 may receive a first power voltage V1 and a second power voltage V2. The first power voltage V1 may have a higher voltage level than the second power voltage V2. For example, the first power voltage V1 may be an operating power voltage of the buffer circuit 100, and the second power voltage V2 may be a ground voltage. The driving circuit 120 may drive, based on the voltage level of the first node ND1, the output node ON to the voltage level of the first power voltage V1. The driving circuit 120 may drive, based on the voltage level of the second node ND2, the output node ON to the voltage level of the second power voltage V2.

The buffer circuit 100 may further include a voltage fixing circuit 130. The voltage fixing circuit 130 may receive the first control signal CON1. Based on the first control signal CON1, the voltage fixing circuit 130 may fix the voltage levels of the first node ND1 and the second node ND2 to predetermined voltage levels. The voltage fixing circuit 130 may be provided to set the voltage level of the output signal OUT when the buffer circuit 100 is deactivated. When the first control signal CON1 is disabled, the voltage fixing circuit 130 may fix the voltage level(s) of the first node ND1 and/or the pull-up control signal PU to a voltage level of the first off-voltage. When the first control signal CON1 is disabled, the voltage fixing circuit 130 may fix the voltage level(s) of the second node ND2 and/or the pull-down control signal PD to a voltage level of the second off-voltage. The voltage level of the first off-voltage may be the same as or different from the voltage level of the second off-voltage. In one embodiment, the first off-voltage may have a higher voltage level than the second off-voltage. The first off-voltage may have the voltage level corresponding to a high logic level and the second off-voltage may have the voltage level corresponding to a low logic level. The driving circuit 120 may set the output signal OUT to a high-impedance state based on the pull-up control signal PU having the voltage level of the first off-voltage and the pull-down control signal PD having the voltage level of the second off-voltage. Furthermore, as the voltage level of the first off-voltage increases and the voltage level of the second off-voltage decreases, an off-leakage current of the driving circuit 120 and the buffer circuit 100 may be reduced. In one embodiment, the first off-voltage and the second off-voltage may have the voltage level corresponding to a high logic level. The driving circuit 120 may set the output signal OUT to a low logic level based on the pull-up control signal PU and the pull-down control signal PD. In one embodiment, the first off-voltage and the second off-voltage may have the voltage level corresponding to a low logic level. The driving circuit 120 may set the output signal OUT to a high logic level based on the pull-up control signal PU and the pull-down control signal PD.

The buffer circuit 100 may further include a voltage adjusting circuit 140. The voltage adjusting circuit 140 may receive a second control signal CON2 and may be selectively activated based on the second control signal CON2. The voltage adjusting circuit 140 may be connected between the first node ND1 and the second node ND2. When the second control signal CON2 is disabled, the voltage adjusting circuit 140 may be deactivated. When the second control signal CON2 is enabled, the voltage adjusting circuit 140 may be activated, may additionally change the voltage level(s) of the first node ND1 and/or the pull-up control signal PU and may additionally change the voltage level(s) of the second node ND2 and/or the pull-down control signal PD. The voltage adjusting circuit 140 may additionally lower the voltage level of the first node ND1 and may additionally raise the voltage level of the second node ND2. The voltage adjusting circuit 140 may lower the voltage level of the first node ND1 to a voltage level lower by a third voltage level than the high boundary voltage level. The voltage level lower by the third voltage level than the high boundary voltage level may be lower than the voltage level lower by the first voltage level than the high boundary voltage level. The voltage level lower by the third voltage level than the high boundary voltage level may be high enough for the driving circuit 120 to determine as a high logic level. The voltage adjusting circuit 140 may raise the voltage level of the second node ND2 to a voltage level higher by a fourth voltage level than the low boundary voltage level. The voltage level higher by the fourth voltage level than the low boundary voltage level may be higher than the voltage level higher by the second voltage level than the low boundary voltage level. The voltage level higher by the fourth voltage level than the low boundary voltage level may be low enough for the driving circuit 120 to determine as a low logic level. The voltage adjusting circuit 140 may additionally change the swing range of the pull-up control signal PU from the first swing range to a third swing range. The third swing range may be smaller than the first swing range and may be between a voltage level, which is lower by the third voltage level than the high boundary voltage level, and the low boundary voltage level. The voltage adjusting circuit 140 may additionally change the swing range of the pull-down control signal PD from the second swing range to a fourth swing range. The fourth swing range may be smaller than the second swing range and may be between the high boundary voltage level and a voltage level, which is higher by the fourth voltage level than the low boundary voltage level.

The buffer circuit 100 may further include an input buffer 150 and an output buffer 160. The input buffer 150 may receive the input signal IN and may be connected to the driving control circuit 110. The input buffer 150 may buffer the input signal IN and may provide the buffered input signal IN to the driving control circuit 110. For example, the input buffer 150 may include an even number of inverters. The output buffer 160 may be connected to the output node ON and may receive the output signal OUT from the output node ON. The output buffer 160 may buffer the output signal OUT and may generate a final output signal FOUT. For example, the output buffer 160 may include an odd number of inverters.

The driving control circuit 110 may include a first transistor N1 and a second transistor P1. The first transistor N1 may be an N-channel MOS transistor, and the second transistor P1 may be a P-channel MOS transistor. The gate of the first transistor N1 may receive the first control signal CON1, and one of the source and drain of the first transistor N1 may receive the input signal IN while the other of the source and drain may be connected to the first node ND1. When the first control signal CON1 is enabled at a high logic level, the first transistor N1 may lower the high boundary voltage level of the input signal IN by the threshold voltage of the first transistor N1 to output the pull-up control signal PU. The first voltage level may be the threshold voltage of the first transistor N1. The voltage level of the pull-up control signal PU output from the first transistor N1 may vary between the voltage level, which is lowered by the threshold voltage of the first transistor N1 from the high boundary voltage level, and the low boundary voltage level. The gate of the second transistor P1 may receive the complementary signal CON1B of the first control signal CON1, and one of the source and drain of the second transistor P1 may receive the input signal IN while the other of the source and drain may be connected to the second node ND2. When the complementary signal CON1B of the first control signal CON1 is enabled at a low logic level, the second transistor P1 may raise the low boundary voltage level of the input signal IN by the threshold voltage of the second transistor P1 to output the pull-down control signal PD. The second voltage level may be the threshold voltage of the second transistor P1. The voltage level of the pull-down control signal PD output from the second transistor P1 may vary between the high boundary voltage level and the voltage level, which is raised by the threshold voltage of the second transistor P1 from the low boundary voltage level.

The driving circuit 120 may include a third transistor P2 and a fourth transistor N2. The third transistor P2 may be a P-channel MOS transistor, and the fourth transistor N2 may be an N-channel MOS transistor. The gate of the third transistor P2 may be connected to the first node ND1 to receive the pull-up control signal PU, the source of the third transistor P2 may receive the first power voltage V1, and the drain of the third transistor P2 may be connected to the output node ON. When the pull-up control signal PU is at a low logic level, the third transistor P2 may supply the first power voltage V1 to the output node ON to pull-up drive the output signal OUT. The gate of the fourth transistor N2 may be connected to the second node ND2 to receive the pull-down control signal PD, the source of the fourth transistor N2 may receive the second power voltage V2, and the drain of the fourth transistor N2 may be connected to the output node ON. When the pull-down control signal PD is at a high logic level, the fourth transistor N2 may allow current to flow from the output node ON to a node, to which the second power voltage V2 is provided, to pull-down drive the output signal OUT.

The voltage fixing circuit 130 may include a fifth transistor P3 and a sixth transistor N3. The fifth transistor P3 may be a P-channel MOS transistor and the sixth transistor N3 may be an N-channel MOS transistor. The gate of the fifth transistor P3 may receive the first control signal CON1. The source of the fifth transistor P3 may receive the first power voltage V1, and the drain of the fifth transistor P3 may be connected to the first node ND1. When the first control signal CON1 is disabled at a low logic level, the fifth transistor P3 may supply the first power voltage V1 to the first node ND1. The gate of the sixth transistor N3 may receive the complementary signal CON1B of the first control signal CON1. The source of the sixth transistor N3 may receive the second power voltage V2, and the drain of the sixth transistor N3 may be connected to the second node ND2. When the complementary signal CON1B of the first control signal CON1 is disabled at a high logic level, the sixth transistor N3 may supply the second power voltage V2 to the second node ND2. When the first control signal CON1 is disabled at a low logic level and the complementary signal CON1B of the first control signal CON1 is disabled at a high logic level, the fifth transistor P3 may fix the pull-up control signal PU to a high logic level and the sixth transistor N3 may fix the pull-down control signal PD to a low logic level. The driving circuit 120 may set the output signal OUT to a high-impedance state based on the pull-up control signal PU and the pull-down control signal PD. When the buffer circuit 100 is deactivated, the buffer circuit 100 may maintain the output signal OUT in a high-impedance state.

The voltage adjusting circuit 140 may include a first inverter IV1 and a second inverter IV2. An input node of the first inverter IV1 may be connected to the first node ND1 to receive the pull-up control signal PU. An output node of the first inverter IV1 may be connected to the second node ND2. The first inverter IV1 may receive the second control signal CON2 and may be activated when the second control signal CON2 is enabled. An input node of the second inverter IV2 may be connected to the output node of the first inverter IV1 and the second node ND2. The second inverter IV2 may receive the pull-down control signal PD through the second node ND2. An output node of the second inverter IV2 may be connected to the input node of the first inverter IV1 and the first node ND1. The second inverter IV2 may receive the second control signal CON2 and may be activated when the second control signal CON2 is enabled. Each current driving force of the first inverter IV1 and the second inverter IV2 may be designed to be small enough to avoid an abnormal operation. For example, the first inverter IV1 may additionally drive the second node ND2 to an extend that a voltage level, which is raised by the fourth voltage level from the low boundary voltage level, can be determined as a low logic level by the fourth transistor N2 of the driving circuit 120. The second inverter IV2 may additionally drive the first node ND1 to an extend that a voltage level, which is lowered by the third voltage level from the high boundary voltage level, can be determined as a high logic level by the third transistor P2 of the driving circuit 120.

Figure 2A:
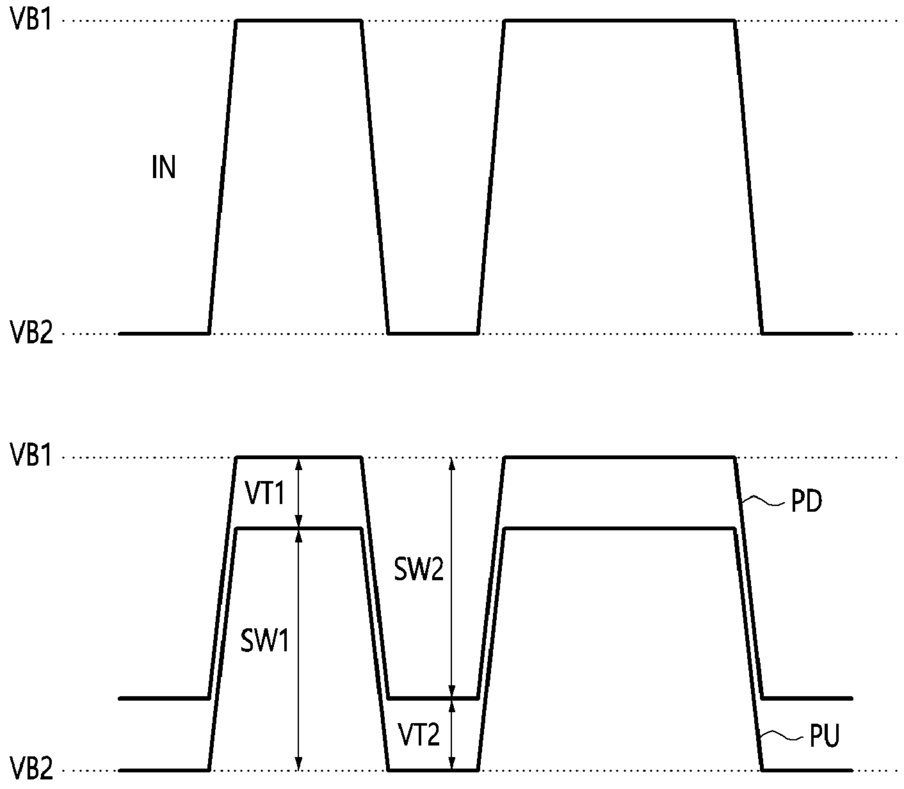
FIG. 2A is a timing diagram illustrating an operation of a buffer circuit in accordance with an embodiment.

FIG. 2A is a timing diagram illustrating an operation of the buffer circuit 100 in accordance with an embodiment. Referring to FIGS. 1 and 2A, the input signal IN may swing between the high boundary voltage level VB1 and the low boundary voltage level VB2. For example, the high boundary voltage level VB1 may correspond to the voltage level of the first power voltage V1 and the low boundary voltage level VB2 may correspond to the voltage level of the second power voltage V2. When the first control signal CON1 is enabled, the driving control circuit 110 may lower the voltage level of the first node ND1 below the high boundary voltage level VB1 and may generate the pull-up control signal PU that swings within the first swing range SW1. The first swing range SW1 may be between the voltage level, which is lower by the threshold voltage of the first transistor N1 and/or the first voltage level VT1 than the high boundary voltage level VB1, and the low boundary voltage level VB2. Furthermore, the driving control circuit 110 may raise the voltage level of the second node ND2 above the low boundary voltage level VB2 and may generate the pull-down control signal PD that swings within the second swing range SW2. The second swing range SW2 may be between the high boundary voltage level and the voltage level, which is higher by the threshold voltage of the second transistor N1 and/or the second voltage level VT2 than the low boundary voltage level VB2. When the swing range of the pull-up control signal PU decreases, the time point at which the pull-up control signal PU transitions from a high logic level to a low logic level becomes earlier. Therefore, the third transistor P1 of the driving circuit 120 may pull-up drive the output signal OUT at a more preceding time point. Similarly, when the swing range of the pull-down control signal PD decreases, the time point at which the pull-down control signal PD transitions from a low logic level to a high logic level becomes earlier. Therefore, the fourth transistor N2 of the driving circuit 120 may pull-down drive the output signal OUT at a more preceding time point. Consequently, the buffer circuit 100 may have improved response speed and performance and the time taken for generating the output signal OUT from the input signal IN may be reduced.

Figure 2B:
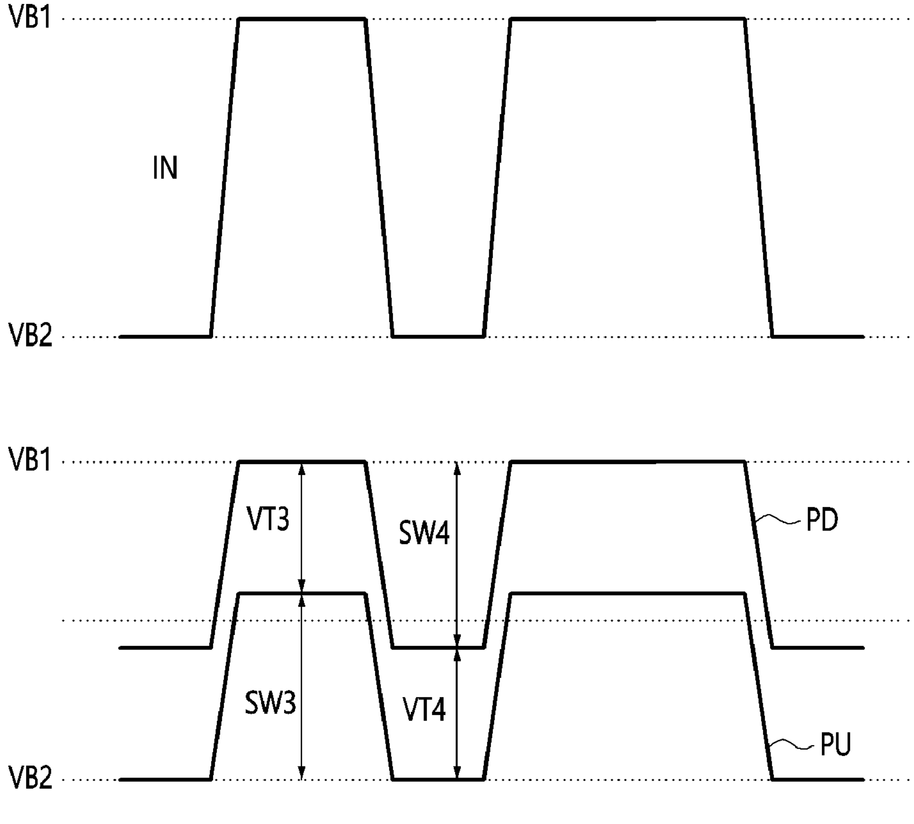
FIG. 2B is a timing diagram illustrating an operation of a buffer circuit in accordance with an embodiment.

FIG. 2B is a timing diagram illustrating an operation of the buffer circuit 100 in accordance with an embodiment. Referring to FIGS. 1 and 2B, when the second control signal CON2 is enabled, each voltage level and/or each swing range of the pull-up control signal PU and the pull-down control signal PD may additionally vary. When the second control signal CON2 is enabled, the first inverter IV1 and the second inverter IV2 may be activated. The first inverter IV1 may additionally raise the voltage level of the second node ND2 based on the voltage level of the first node ND1, and the second inverter IV2 may additionally lower the voltage level of the first node ND1 based on the voltage level of the second node ND2. The first inverter IV1 may invertedly drive the pull-up control signal PU, and the voltage level of the pull-down control signal PD may be additionally raised by the output signal of the first inverter IV1 when the pull-up control signal PU is at a low logic level. Therefore, the pull-down control signal PD may swing within the fourth swing range SW4. The fourth swing range SW4 may be between the high boundary voltage level VB1 and the voltage level, which is raised by the fourth voltage level VT4 from the low boundary voltage level VB2. The fourth voltage level VT4 may be the sum of the second voltage level VT2 and the voltage level that can be changed by the current driving force of the first inverter IV1. The second inverter IV2 may invertedly drive the pull-down control signal PD, and the voltage level of the pull-up control signal PU may be additionally lowered by the output signal of the second inverter IV2 when the pull-down control signal PD is at a high logic level. Therefore, the pull-up control signal PU may swing within the third swing range SW3. The third swing range SW3 may be between the voltage level, which is lowered by the third voltage level VT3 from the high boundary voltage level VB1, and the low boundary voltage level VB2. The third voltage level VT3 may be the sum of the first voltage level VT1 and the voltage level that can be changed by the current driving force of the second inverter IV2. When the second control signal CON2 is enabled and the first inverter IV1 and the second inverter IV2 are activated, the swing range(s) of the first node ND1 and/or the pull-up control signal PU as well as the swing range(s) of the second node ND2 and/or the pull-down control signal PD are additionally decreased. As a result, the buffer circuit 100 may achieve a faster response speed and may further reduce the time taken for generating the output signal OUT from the input signal IN.

Figure 3A:
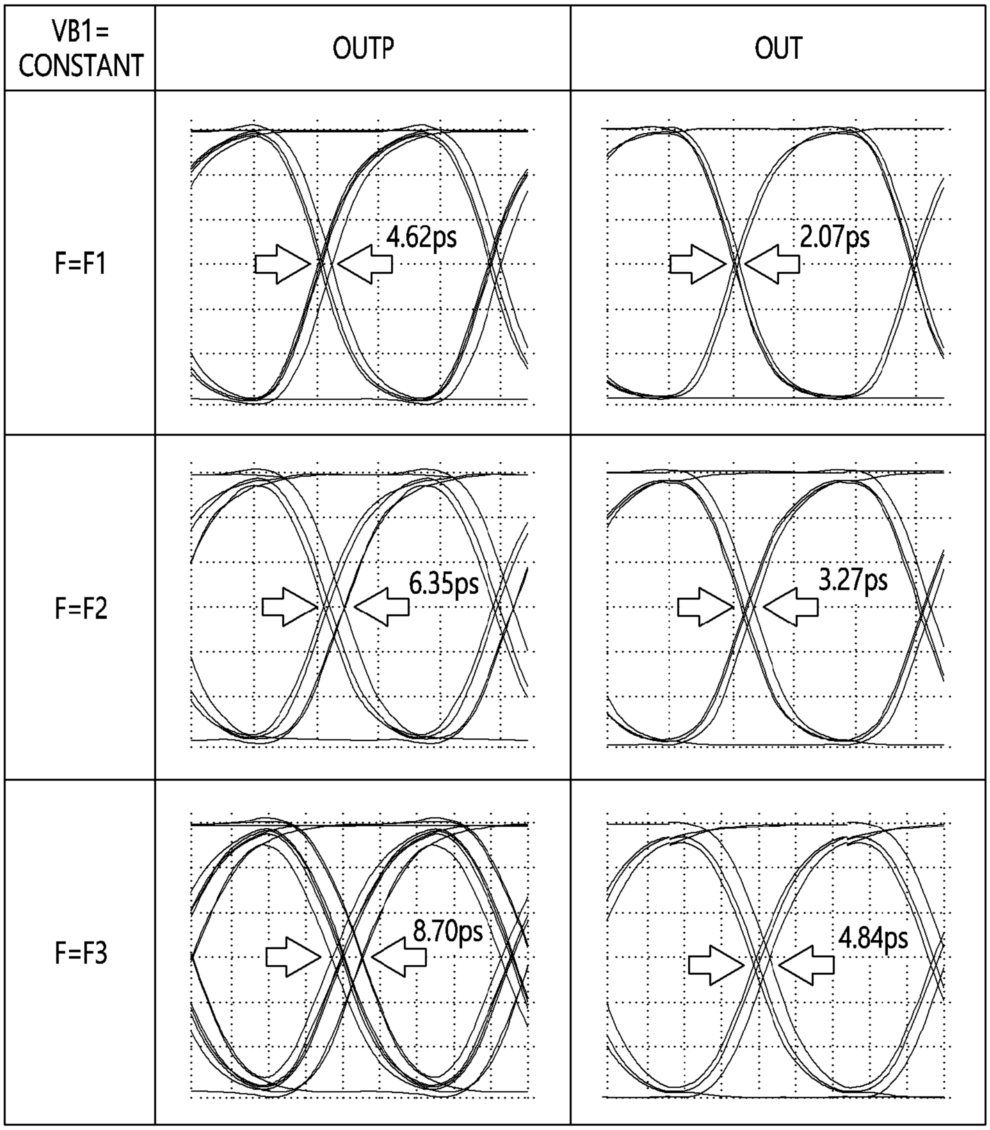
FIG. 3A is a diagram illustrating waveforms of output signals according to variation of a frequency of an input signal when a high boundary voltage level and a low boundary voltage level remain constant.

FIG. 3A is a diagram illustrating waveforms of output signals OUTP and OUT according to variation of a frequency F of the input signal IN when the high boundary voltage level VB1 and the low boundary voltage level VB2 remain constant. In FIG. 3A, the first frequency F1 may be lower than the second frequency F2, and the second frequency F2 may be lower than the third frequency F3. When the input signal IN has the frequency F equal to the first frequency F1, the output signal OUT generated by a typical buffer circuit may have a jitter characteristic of 4.62 ps (pico seconds) but the buffer circuit 100 may generate the output signal OUT with a jitter characteristic of 2.07 ps. The jitter characteristic refers to the interval between the earliest and latest time points of forming a cross-point at which the logic level of the output signal generated by the buffer circuit transitions. When the input signal IN has the frequency F equal to the second frequency F2, the output signal OUTP generated by a typical buffer circuit may have a jitter characteristic of 6.35 ps but the buffer circuit 100 may generate the output signal OUT with a jitter characteristic of 3.27 ps. When the input signal IN has the frequency F equal to the third frequency F3, the output signal OUTP generated by a typical buffer circuit may have a jitter characteristic of 8.70 ps but the buffer circuit 100 may generate the output signal OUT with a jitter characteristic of 4.84 ps. It is evident that the improvement in the response speed and performance of the buffer circuit 100 results in an improvement in the jitter characteristic of the output signal OUT.

Figure 3B:
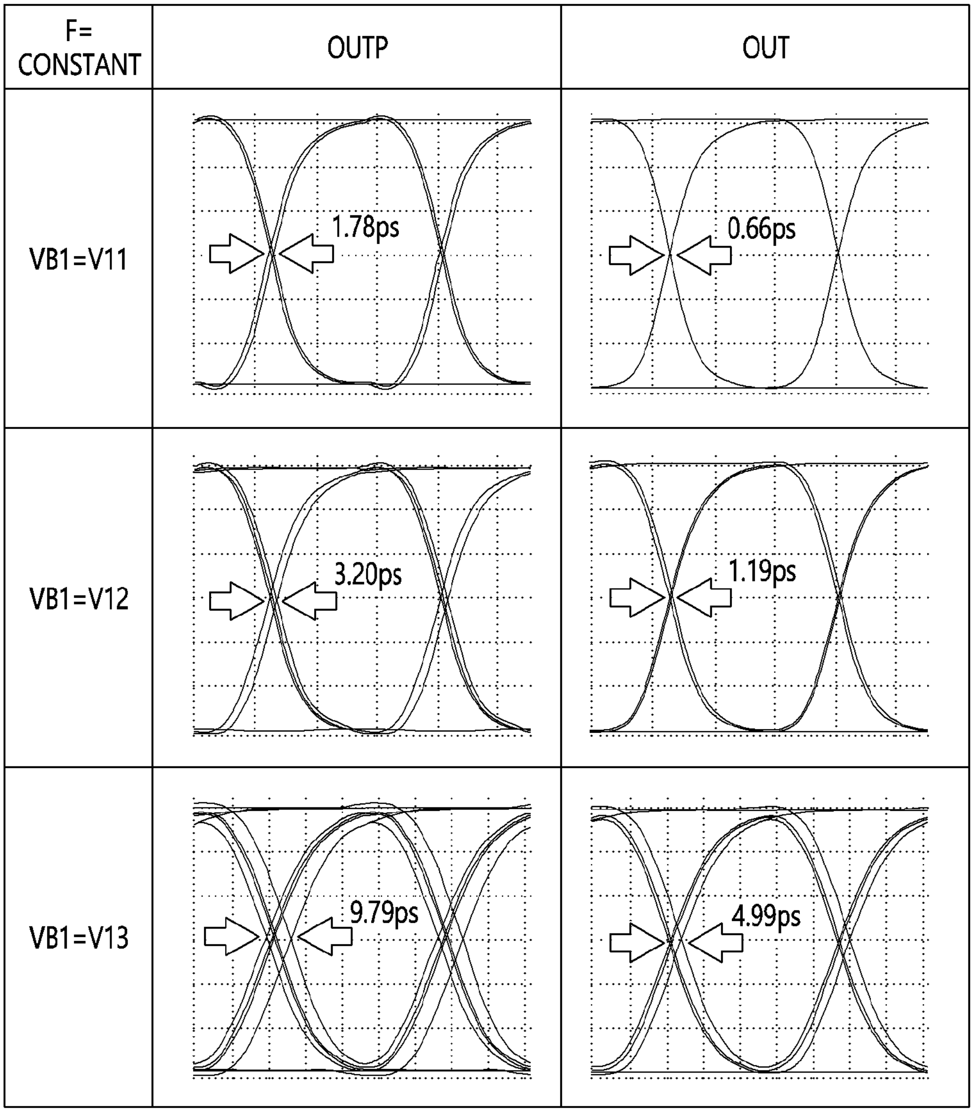
FIG. 3B is a diagram showing waveforms of output signals according to variation of the high boundary voltage level when a frequency of an input signal remains constant.

FIG. 3B is a diagram showing waveforms of output signals OUTP and OUT according to variation of the high boundary voltage level VB1 when the frequency F of the input signal IN remains constant. In FIG. 3B, the first voltage level V11 may be higher than the second voltage level V12 and the second voltage level V12 may be higher than the third voltage level V13. The low boundary voltage level VB2 may remain constant. When the high boundary voltage level VB1 is set to the first voltage level V11, the output signal OUTP generated by a typical buffer circuit may have a jitter characteristic of 1.78 ps but the buffer circuit 100 may generate the output signal OUT with a jitter characteristic of 0.66 ps. When the high boundary voltage level VB1 is set to the second voltage level V12, the output signal OUTP generated by a typical buffer circuit may have a jitter characteristic of 3.20 ps but the buffer circuit 100 may generate the output signal OUT with a jitter characteristic of 1.19 ps. When the high boundary voltage level VB1 is set to the third voltage level V13, the output signal OUTP generated by a typical buffer circuit may have a jitter characteristic of 9.79 ps but the buffer circuit 100 may generate the output signal OUT with a jitter characteristic of 4.99 ps. It is evident that the improvement in the response speed and performance of the buffer circuit 100 leads to an improvement in the jitter characteristic of the output signal OUT.

Figure 4A:
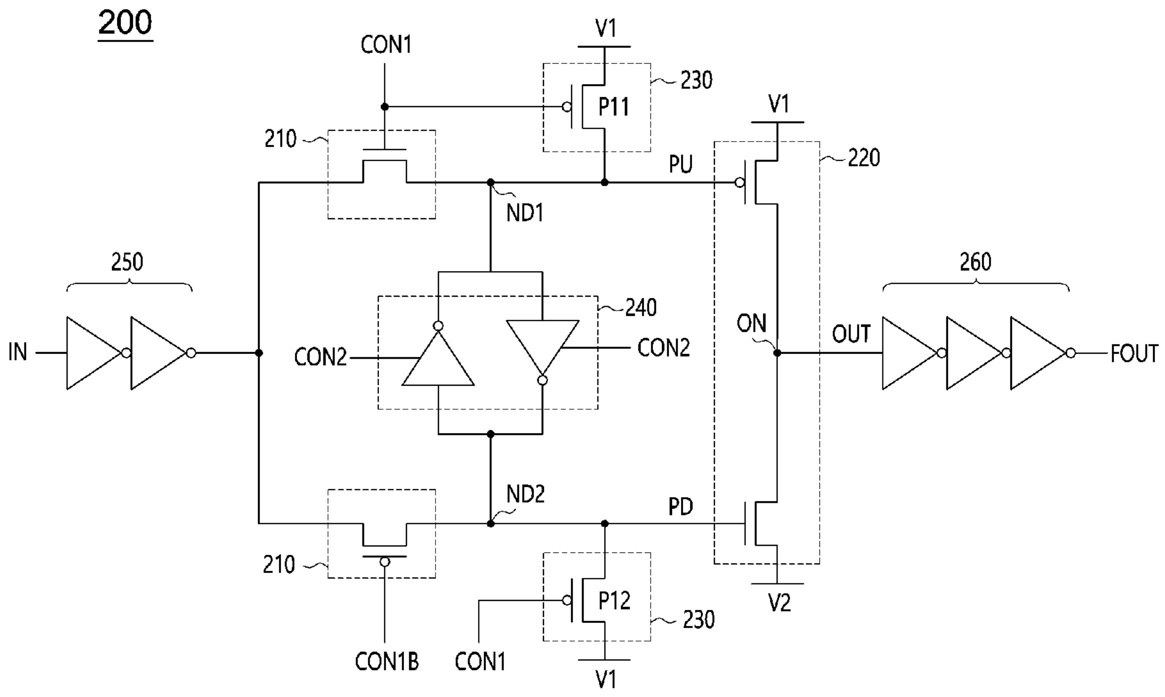
FIG. 4A is a diagram illustrating a configuration of a buffer circuit in accordance with an embodiment.

FIG. 4A is a diagram illustrating a configuration of a buffer circuit 200 in accordance with an embodiment. Referring to FIG. 4A, the buffer circuit 200 may include a driving control circuit 210, a driving circuit 220, a voltage fixing circuit 230, a voltage adjusting circuit 240, an input buffer 250 and an output buffer 260. The driving control circuit 210, the driving circuit 220, the voltage adjusting circuit 240, the input buffer 250 and the output buffer 260 have substantially the same configuration and may perform substantially the same functions as the driving control circuit 110, the driving circuit 120, the voltage adjusting circuit 140, the input buffer 150 and the output buffer 160 described in FIG. 1. Duplicate description for the elements having the same configuration and functionality is omitted. The voltage fixing circuit 230 may fix, based on the first control signal CON1, the pull-up control signal PU and the pull-down control signal PD to the same voltage level. For example, when the first control signal CON1 is disabled at a low logic level, the voltage fixing circuit 230 may set both the pull-up control signal PU and the pull-down control signal PD to the first off-voltage level. The first off-voltage level may be substantially identical to the voltage level of the first power voltage V1.

The voltage fixing circuit 230 may include a first transistor P11 and a second transistor P12. Both the first transistor P11 and the second transistor P12 may be P-channel MOS transistors. The gate of the first transistor P11 may receive the first control signal CON1, the source of the first transistor P11 may receive the first power voltage V1 and the drain of the first transistor P11 may be connected to the first node ND1. When the first control signal CON1 is disabled at a low logic level, the first transistor P11 may supply the first power voltage V1 to the first node ND1 to drive the pull-up control signal PU to the first power voltage V1. The gate of the second transistor P12 may receive the first control signal CON1, the source of the second transistor P12 may receive the first power voltage V1 and the drain of the second transistor P12 may be connected to the second node ND2. When the first control signal CON1 is disabled at a low logic level, the second transistor P12 may supply the first power voltage V1 to the second node ND2 to drive the pull-down control signal PD to the first power voltage V1. When both the first node ND1 and the second node ND2 are fixed at the voltage level of the first power voltage V1, the driving circuit 220 may generate the output signal OUT of a low logic level. When the buffer circuit 200 is deactivated, the driving circuit 220 may keep the output signal OUT at a low logic level.

Figure 4B:
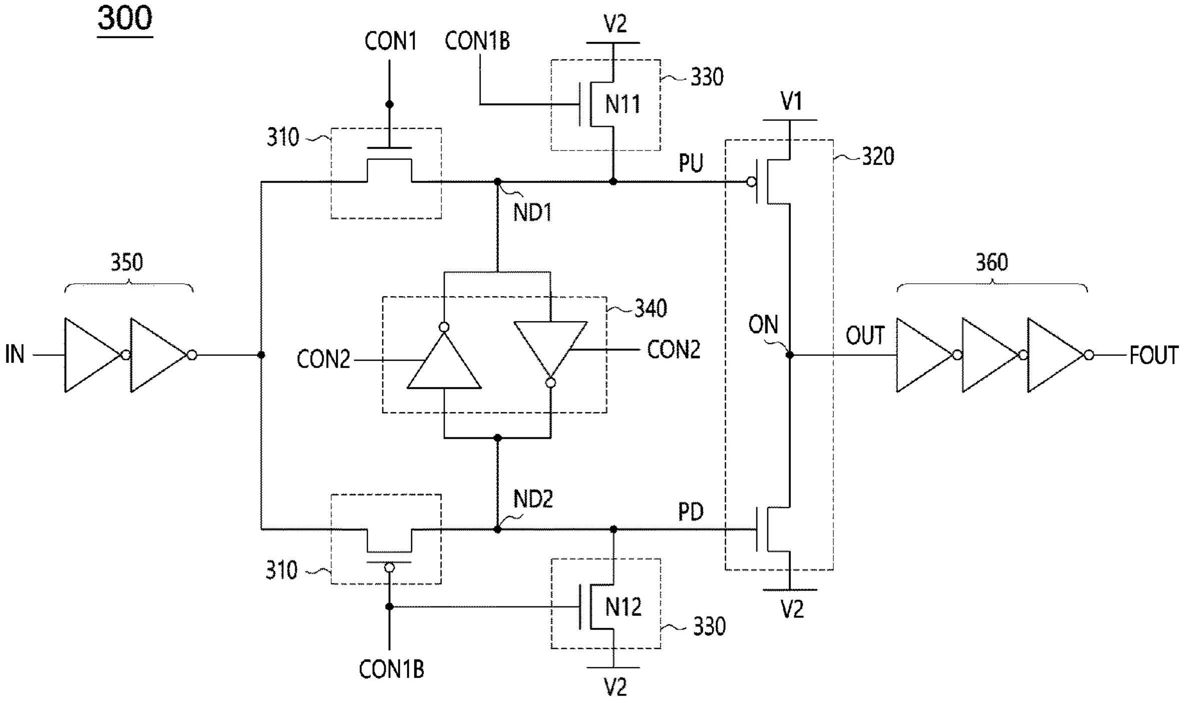
FIG. 4B is a diagram illustrating a configuration of a buffer circuit in accordance with an embodiment.

FIG. 4B is a diagram illustrating a configuration of a buffer circuit 300 in accordance with an embodiment. Referring to FIG. 4B, the buffer circuit 300 may include a driving control circuit 310, a driving circuit 320, a voltage fixing circuit 330, a voltage adjusting circuit 340, an input buffer 350 and an output buffer 360. The driving control circuit 310, the driving circuit 320, the voltage adjusting circuit 340, the input buffer 350 and the output buffer 360 may have the same configuration and may perform the same functions as the driving control circuit 110, the driving circuit 120, the voltage adjusting circuit 140, the input buffer 150 and the output buffer 160 described in FIG. 1. Duplicate description for the elements having the same configuration and functionality is omitted. The voltage fixing circuit 330 may fix, based on the first control signal CON1, the pull-up control signal PU and the pull-down control signal PD to the same voltage level. The voltage fixing circuit 330 may receive the complementary signal CON1B of the first control signal CON1. For example, when the complementary signal CON1B of the first control signal CON1 is disabled at a high logic level, the voltage fixing circuit 330 may set both the pull-up control signal PU and the pull-down control signal PD to the second off-voltage level. The second off-voltage level may be the same as the voltage level of the second power voltage V2.

The voltage fixing circuit 330 may include a first transistor N11 and a second transistor N12. Both the first transistor N11 and the second transistor N12 may be N-channel MOS transistors. The gate of the first transistor N11 may receive the complementary signal CON1B of the first control signal CON1, the source of the first transistor N11 may receive the second power voltage V2 and the drain of the first transistor N11 may be connected to the first node ND1. When the complementary signal CON1B of the first control signal CON1 is disabled at a high logic level, the first transistor N11 may supply the second power voltage V2 to the first node ND1 to drive the pull-up control signal PU to the second power voltage V2. The gate of the second transistor N12 may receive the complementary signal CON1B of the first control signal CON1, the source of the second transistor N12 may receive the second power voltage V2 and the drain of the second transistor N12 may be connected to the second node ND2. When the complementary signal CON1B of the first control signal CON1 is disabled at a high logic level, the second transistor N12 may supply the second power voltage V2 to the second node ND2. When both the first node ND1 and the second node ND2 are fixed to the voltage level of the second power voltage V2, the driving circuit 320 may generate the output signal OUT of a high logic level. When the buffer circuit 300 is deactivated, the buffer circuit 300 may keep the output signal OUT at a high logic level.

Figure 5:
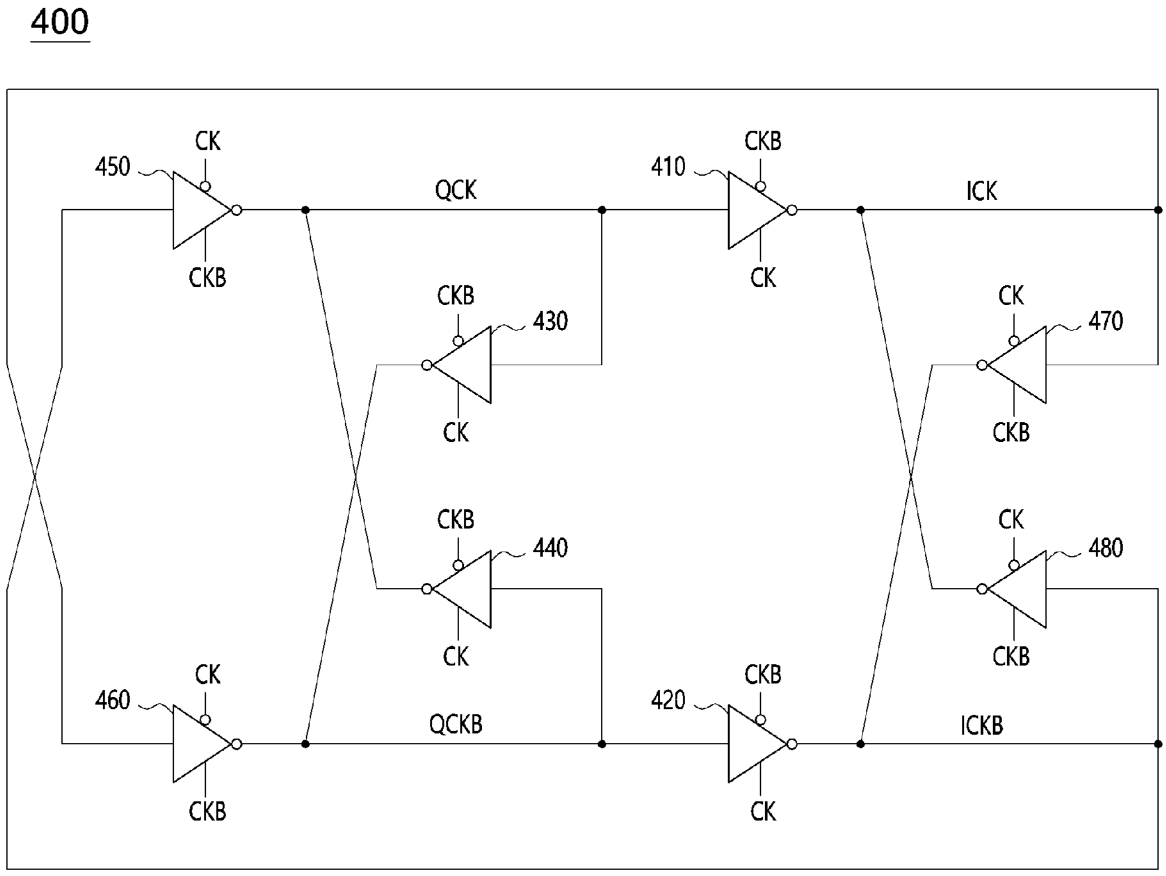
FIG. 5 is a diagram illustrating a configuration of a clock generating circuit in accordance with an embodiment.

FIG. 5 is a diagram illustrating a configuration of a clock generating circuit 400 in accordance with an embodiment. Referring to FIG. 5, the clock generating circuit 400 may receive a clock signal CK and a complementary clock signal CKB to generate a first divisional clock signal ICK, a second divisional clock signal QCK, a third divisional clock signal ICKB and a fourth divisional clock signal QCKB. The clock generating circuit 400 may be a clock dividing circuit configured to divide the frequency of the clock signal CK and the complementary clock signal CKB to generate the first to fourth divisional clock signals ICK, QCK, ICKB and QCKB. The frequency of the first to fourth divisional clock signals ICK, QCK, ICKB and QCKB may be half of the frequency of the clock signal CK and the complementary clock signal CKB. The period of the first to fourth divisional clock signals ICK, QCK, ICKB and QCKB may be twice the period of the clock signal CK and the complementary clock signal CKB. The first to fourth divisional clock signals ICK, QCK, ICKB and QCKB may sequentially have a phase difference of 90° between each other. The first divisional clock signal ICK may have a leading phase of 90° to the second divisional clock signal QCK. The second divisional clock signal QCK may have a leading phase of 90° to the third divisional clock signal ICKB. The third divisional clock signal ICKB may have a leading phase of 90° to the fourth divisional clock signal QCKB. The fourth divisional clock signal QCKB may have a leading phase of 90° to the first divisional clock signal ICK.

The clock generating circuit 400 may include a first inverter 410, a second inverter 420, a third inverter 430, a fourth inverter 440, a fifth inverter 450, a sixth inverter 460, a seventh inverter 470 and an eighth inverter 480. The first to eighth inverters 410 to 480 may be tri-state inverters. The first inverter 410 may receive, as control signals, the clock signal CK and the complementary clock signal CKB and may receive the second divisional clock signal QCK to output the first divisional clock signal ICK. The first inverter 410 may be activated when the clock signal CK is at a high logic level and the complementary clock signal CKB is at a low logic level. The first inverter 410 may invertedly drive the second divisional clock signal QCK to output the first divisional clock signal ICK. The second inverter 420 may receive, as control signals, the clock signal CK and the complementary clock signal CKB and may receive the fourth divisional clock signal QCKB to output the third divisional clock signal ICKB. The second inverter 420 may be activated when the clock signal CK is at a high logic level and the complementary clock signal CKB is at a low logic level. The second inverter 420 may invertedly drive the fourth divisional clock signal QCKB to output the third divisional clock signal ICKB. The third inverter 430 may receive, as control signals, the clock signal CK and the complementary clock signal CKB and may receive the second divisional clock signal QCK to output the fourth divisional clock signal QCKB. The third inverter 430 may be activated when the clock signal CK is at a high logic level and the complementary clock signal CKB is at a low logic level. The third inverter 430 may invertedly drive the second divisional clock signal QCK to output the fourth divisional clock signal QCKB. The fourth inverter 440 may receive, as control signals, the clock signal CK and the complementary clock signal CKB and may receive the fourth divisional clock signal QCKB to output the second divisional clock signal QCK. The fourth inverter 440 may be activated when the clock signal CK is at a high logic level and the complementary clock signal CKB is at a low logic level. The fourth inverter 440 may invertedly drive the fourth divisional clock signal QCKB to output the second divisional clock signal QCK.

The fifth inverter 450 may receive, as control signals, the clock signal CK and the complementary clock signal CKB and may receive the third divisional clock signal ICKB to output the second divisional clock signal QCK. The fifth inverter 450 may be activated when the clock signal CK is at a low logic level and the complementary clock signal CKB is at a high logic level. The fifth inverter 450 may invertedly drive the third divisional clock signal ICKB to output the second divisional clock signal QCK. The sixth inverter 460 may receive, as control signals, the clock signal CK and the complementary clock signal CKB and may receive the first divisional clock signal ICK to output the fourth divisional clock signal QCKB. The sixth inverter 460 may be activated when the clock signal CK is at a low logic level and the complementary clock signal CKB is at a high logic level. The sixth inverter 460 may invertedly drive the first divisional clock signal ICK to output the fourth divisional clock signal QCKB. The seventh inverter 470 may receive, as control signals, the clock signal CK and the complementary clock signal CKB and may receive the first divisional clock signal ICK to output the third divisional clock signal ICKB. The seventh inverter 470 may be activated when the clock signal CK is at a low logic level and the complementary clock signal CKB is at a high logic level. The seventh inverter 470 may invertedly drive the first divisional clock signal ICK to output the third divisional clock signal ICKB. The eighth inverter 480 may receive, as control signals, the clock signal CK and the complementary clock signal CKB and may receive the third divisional clock signal ICKB to output the first divisional clock signal ICK. The eighth inverter 480 may be activated when the clock signal CK is at a low logic level and the complementary clock signal CKB is at a high logic level. The eighth inverter 480 may invertedly drive the third divisional clock signal ICKB to output the first divisional clock signal ICK. At least one of the buffer circuits 100, 200 and 300 described in FIGS. 1, 4A and 4B may be applied as at least one of the first to eighth inverters 410 to 480.

Figure 6:
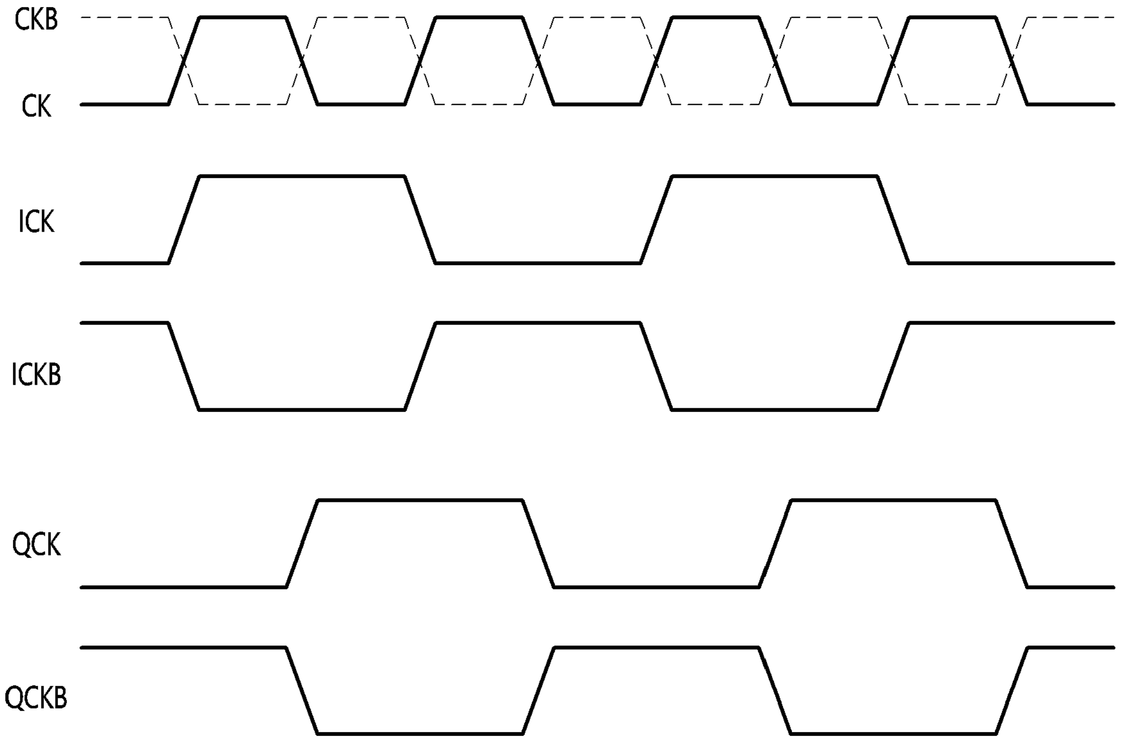
FIG. 6 is a timing diagram illustrating an operation of the clock generating circuit shown in FIG. 5.

FIG. 6 is a timing diagram illustrating an operation of the clock generating circuit 400 shown in FIG. 5. Referring to FIGS. 5 and 6, the initial state of the first divisional clock signal ICK and the second divisional clock signal QCK may be a low logic level and the initial state of the third divisional clock signal ICKB and the fourth divisional clock signal QCKB may be a high logic level. During the interval when the clock signal CK is at a low logic level and the complementary clock signal CKB is at a high logic level, the fifth to eighth inverters 450 to 480 may be activated and the first to fourth inverters 410 to 440 may be deactivated. The fifth inverter 450 may invertedly drive the third divisional clock signal ICKB of a high logic level to output the second divisional clock signal QCK of a low logic level. The sixth inverter 460 may invertedly drive the first divisional clock signal ICK of a low logic level to output the fourth divisional clock signal QCKB of a high logic level. The seventh inverter 470 may invertedly drive the first divisional clock signal ICK of a low logic level to output the third divisional clock signal ICKB of a high logic level. The eighth inverter 480 may invertedly drive the third divisional clock signal ICKB of a high logic level to output the first divisional clock signal ICK of a low logic level. When the clock signal CK transitions from a low logic level to a high logic level for the first time and the complementary clock signal CKB transitions from a high logic level to a low logic level for the first time, the first to fourth inverters 410 to 440 may be activated and the fifth to eighth inverters 450 to 480 may be deactivated. During the interval when the clock signal CK is at a high logic level and the complementary clock signal CKB is at a low logic level, the first inverter 410 may invertedly drive the second divisional clock signal QCK having low logic level to output the first divisional clock signal ICK of a high logic level and the first divisional clock signal ICK may transition from a low logic level to a high logic level. The second inverter 420 may invertedly drive the fourth divisional clock signal QCKB of a high logic level to output the third divisional clock signal ICKB of a low logic level and the third divisional clock signal ICKB may transition from a high logic level to a low logic level. The third inverter 430 may invertedly drive the second divisional clock signal QCK of a low logic level to output the fourth divisional clock signal QCKB of a high logic level and the fourth divisional clock signal QCKB may stay at a high logic level. The fourth inverter 440 may invertedly drive the fourth divisional clock signal QCKB of a high logic level to output the second divisional clock signal QCK of a low logic level and the second divisional clock signal QCK may stay at a low logic level.

When the clock signal CK transitions from a high logic level to a low logic level for the first time and the complementary clock signal CKB transitions from a low logic level to a high logic level for the first time, the fifth to eighth inverters 450 to 480 may be activated and the first to fourth inverters 410 to 440 may be deactivated. The fifth inverter 450 may invertedly drive the third divisional clock signal ICKB of a low logic level to output the second divisional clock signal QCK of a high logic level and the second divisional clock signal QCK may transition from a low logic level to a high logic level. The sixth inverter 460 may invertedly drive the first divisional clock signal ICK of a high logic level to output the fourth divisional clock signal QCKB of a low logic level and the fourth divisional clock signal QCKB may transition from a high logic level to a low logic level. The seventh inverter 470 may invertedly drive the first divisional clock signal ICK of a high logic level to output the third divisional clock signal ICKB of a low logic level and the third divisional clock signal ICKB may stay at a low logic level. The eighth inverter 480 may invertedly drive the third divisional clock signal ICKB of a low logic level to output the first divisional clock signal ICK of a high logic level and the first divisional clock signal ICK may stay at a high logic level.

When the clock signal CK transitions from a low logic level to a high logic level for the second time and the complementary clock signal CKB transitions from a high logic level to a low logic level for the second time, the first to fourth inverters 410 to 440 may be activated and the fifth to eighth inverters 450 to 480 may be deactivated. In the interval where the clock signal CK is at a high logic level and the complementary clock signal CKB is at a low logic level, the first inverter 410 may invertedly drive the second divisional clock signal QCK of a high logic level to output the first divisional clock signal ICK of a low logic level and the first divisional clock signal ICK may transition from a high logic level to a low logic level. The second inverter 420 may invertedly drive the fourth divisional clock signal QCKB of a low logic level to output the third divisional clock signal ICKB of a high logic level and the third divisional clock signal ICKB may transition from a low logic level to a high logic level. The third inverter 430 may invertedly drive the second divisional clock signal QCK of a high logic level to output the fourth divisional clock signal QCKB of a low logic level and the fourth divisional clock signal QCKB may stay at a low logic level. The fourth inverter 440 may invertedly drive the fourth divisional clock signal QCKB of a low logic level to output the second divisional clock signal QCK of a high logic level and the second divisional clock signal QCK may stay at a high logic level. As the clock signal CK and the complementary clock signal CKB transition repeatedly between logic levels, the clock generating circuit 400 may generate the first to fourth divisional clock signals ICK, QCK, ICKB and QCKB having a longer period than the clock signal CK and the complementary clock signal CKB and having 90° phase difference between each other. When any of the first to eighth inverters 410 to 480 includes at least one of the buffer circuits 100, 200 and 300 described with reference to FIGS. 1, 4A and 4B, the clock generating circuit 400 may achieve improved response time and performance and may more promptly generate the first to fourth divisional clock signals ICK, QCK, ICKB and QCKB having accurate phases.

Figure 7:
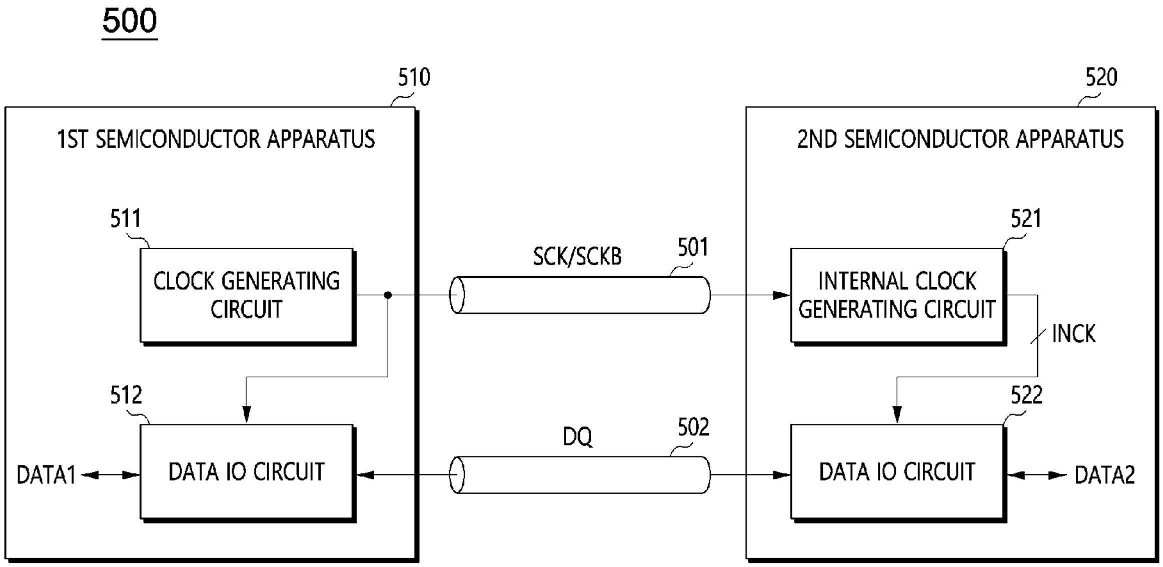
FIG. 7 is a diagram illustrating a configuration of a semiconductor system in accordance with an embodiment.

FIG. 7 is a diagram illustrating a configuration of a semiconductor system 500 in accordance with an embodiment. Referring to FIG. 7, the semiconductor system 500 may include a first semiconductor apparatus 510 and a second semiconductor apparatus 520. The first semiconductor apparatus 510 may be a master device configured to provide the second semiconductor apparatus 520 with various control signals required for the operation of the second semiconductor apparatus 520. The second semiconductor apparatus 520 may be a slave device configured to perform various operations under the control of the first semiconductor apparatus 510. The first semiconductor apparatus 510 may include various host devices. For example, first semiconductor apparatus 510 may include a central processing unit (CPU), a graphics processing unit (GPU), a multimedia processor (MMP), a digital signal processor (DSP), an application processor (AP), a memory controller and so forth. Furthermore, the first semiconductor apparatus 510 may be a testing device or test equipment for the second semiconductor apparatus 520. For example, the second semiconductor apparatus 520 may be a memory device including volatile memory and non-volatile memory. The volatile memory may include static random-access memory (static RAM: SRAM), dynamic RAM (DRAM) and synchronous DRAM (SDRAM). The non-volatile memory may include read-only memory (ROM), programmable ROM (PROM), electrically erasable and programmable ROM (EEPROM), electrically programmable ROM (EPROM), flash memory, phase-change RAM (PRAM), magnetic RAM (MRAM), resistive RAM (RRAM), ferroelectric RAM (FRAM) and so forth.

The second semiconductor apparatus 520 may be connected to the first semiconductor apparatus 510 through a plurality of buses. Each of the plurality of buses may be a signal transmission path, a link or a channel configured to transfer a signal. The plurality of buses may include a clock bus 501, a data bus 502 and so forth. The clock bus 501 may be a unidirectional bus from the first semiconductor apparatus 510 to the second semiconductor apparatus 520, and the data bus 502 may be a bidirectional bus between the first semiconductor apparatus 510 and the second semiconductor apparatus 520. The second semiconductor apparatus 520 may be connected to the first semiconductor apparatus 510 through the clock bus 501 and may receive a system clock signal SCK through the clock bus 501. The system clock signal SCK may be transmitted along with a complementary signal SCKB. The second semiconductor apparatus 520 may be connected to the first semiconductor apparatus 510 through the data bus 502 and may receive, through the data bus 502, data DQ from the first semiconductor apparatus 510 and provide, through the data bus 502, data DQ to the first semiconductor apparatus 510. The first semiconductor apparatus 510 may transmit data DQ to the second semiconductor apparatus 520 based on the system clock signal SCK and the complementary signal SCKB. The second semiconductor apparatus 520 may transmit data DQ to the first semiconductor apparatus 510 based on the system clock signal SCK and the complementary signal SCKB. Although not illustrated, the semiconductor system 500 may include a command/address bus, through which the second semiconductor apparatus 520 may be connected to the first semiconductor apparatus 510. The command/address bus may be a unidirectional bus from the first semiconductor apparatus 510 to the second semiconductor apparatus 520. The first semiconductor apparatus 510 may provide a command/address signal to the second semiconductor apparatus 520 through the command/address bus to direct the operation to be performed by the second semiconductor apparatus 520. The first semiconductor apparatus 510 may provide the second semiconductor apparatus 520 with a command/address signal in synchronization with the system clock signal SCK and the complementary signal SCKB.

The first semiconductor apparatus 510 may include a clock generating circuit 511 and a data input/output circuit 512. The clock generating circuit 511 may generate the system clock signal SCK and the complementary signal SCKB. The clock generating circuit 511 may transmit the system clock signal SCK and SCKB to the second semiconductor apparatus 520 through the clock bus 501. The clock generating circuit 511 may provide the system clock signal SCK and the complementary signal SCKB to the data input/output circuit 512. The clock generating circuit 511 may include a clock generator such as an oscillator, a phase-locked loop, a delay-locked loop, a clock divider and so forth to generate the system clock signal SCK and the complementary signal SCKB, which have a consistent frequency and toggle. The clock generating circuit 511 may include the clock generating circuit 400 illustrated in FIG. 5.

The data input/output circuit 512 may be connected to the data bus 502. The data input/output circuit 512 may generate the data DQ based on internal data DATA1 of the first semiconductor apparatus 510 and may transmit the data DQ to the second semiconductor apparatus 520 through the data bus 502. The data input/output circuit 512 may receive the data DQ transmitted from the second semiconductor apparatus 520 through the data bus 502 and may generate the internal data DATA1 based on the data DQ. The data input/output circuit 512 may receive the system clock signal SCK and the complementary signal SCKB from the clock generating circuit 511. The data input/output circuit 512 may transmit or receive the data DQ in synchronization with the system clock signal SCK and the complementary signal SCKB. In an embodiment, the data input/output circuit 512 may be modified to receive the data DQ in synchronization with a clock signal (e.g., a data strobe signal) from the second semiconductor apparatus 520.

The semiconductor apparatus 520 may include an internal clock generating circuit 521 and a data input/output circuit 522. The internal clock generating circuit 521 may be connected to the clock bus 501 and may receive the system clock signal SCK and the complementary signal SCKB from the first semiconductor apparatus 510 through the clock bus 501. Based on the system clock signal SCK and the complementary signal SCKB, the internal clock generating circuit 521 may generate a plurality of internal clock signals INCK. The plurality of internal clock signals INCK may have the same frequency as the system clock signal SCK and the complementary signal SCKB. In an embodiment, the plurality of internal clock signals INCK may have a lower frequency than the system clock signal SCK and the complementary signal SCKB. In an embodiment, the plurality of internal clock signals INCK may have a higher frequency than the system clock signal SCK and the complementary signal SCKB. The internal clock generating circuit 521 may buffer the system clock signal SCK and the complementary signal SCKB or divide/multiply the frequency of the system clock signal SCK and the complementary signal SCKB to generate the plurality of internal clock signals INCK. To divide the frequency of the system clock signal SCK and the complementary signal SCKB for generating the plurality of internal clock signals INCK, the internal clock generating circuit 521 may include the clock generating circuit 400 illustrated in FIG. 5. The internal clock generating circuit 521 may provide the plurality of internal clock signals INCK to the data input/output circuit 522.

The data input/output circuit 522 may be connected to the data bus 502 to receive, through the data bus 502, the data DQ transmitted from the first semiconductor apparatus 510 or transmit, through the data bus 502, the data DQ to the first semiconductor apparatus 510. The data input/output circuit 522 may generate, based on internal data DATA2 of the second semiconductor apparatus 520, the data DQ and may transmit the data DQ to the first semiconductor apparatus 510 through the data bus 502. The data input/output circuit 522 may receive the data DQ transmitted from the first semiconductor apparatus 510 and may generate the internal data DATA2 based on the data DQ. The data input/output circuit 522 may receive the plurality of internal clock signals INCK generated by the internal clock generating circuit 521. In synchronization with the plurality of internal clock signals INCK, the data input/output circuit 522 may provide the data DQ to the first semiconductor apparatus 510 and may receive the data DQ transmitted from the first semiconductor apparatus 510.

Figure 8:
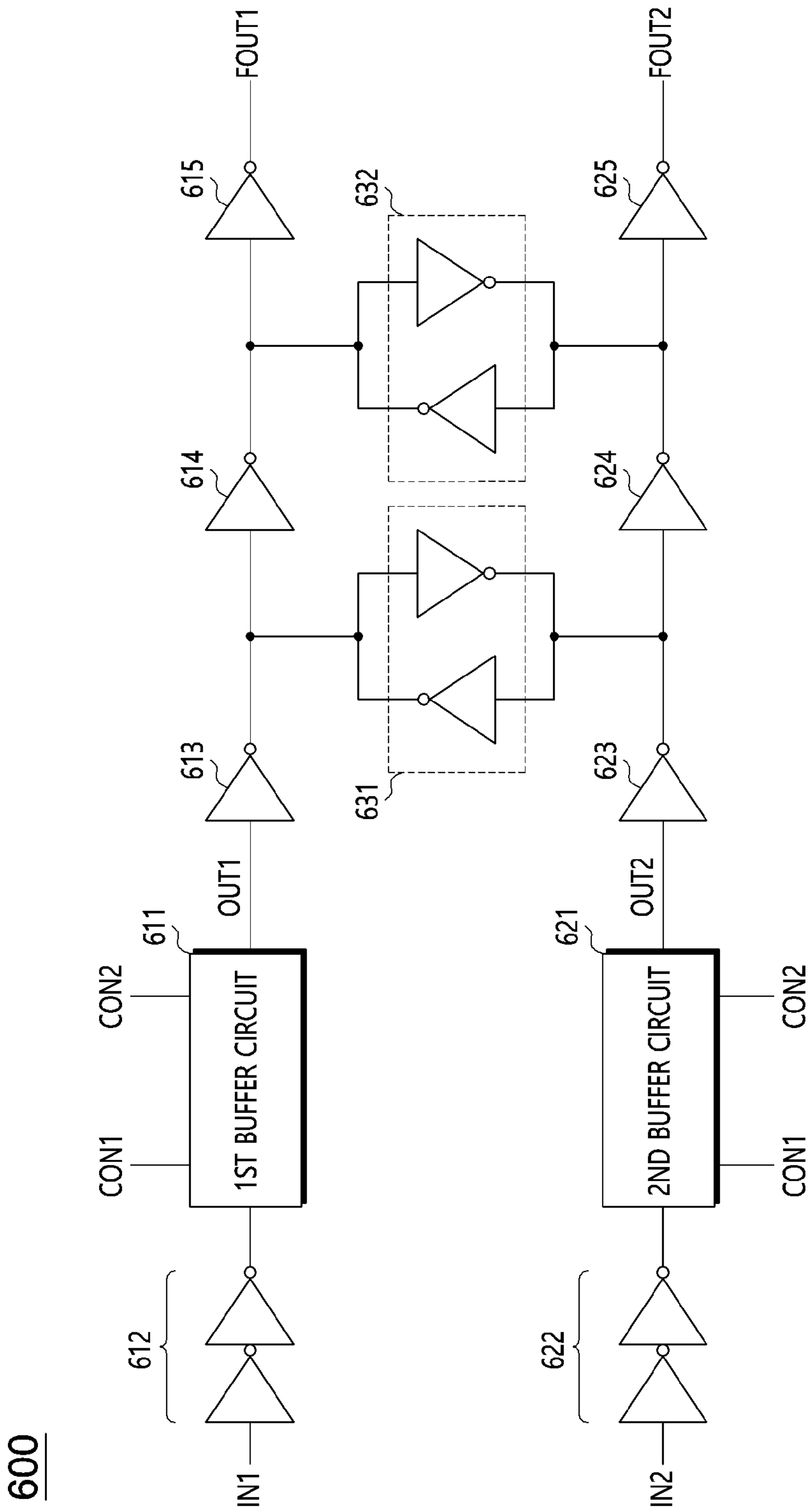
FIG. 8 is a diagram illustrating a configuration of a differential buffer circuit in accordance with an embodiment.

FIG. 8 is a diagram illustrating a configuration of a differential buffer circuit 600 in accordance with an embodiment. Referring to FIG. 8, the differential buffer circuit 600 may receive a first input signal IN1 and a second input signal IN2 to generate a first output signal OUT1 and a second output signal OUT2. The differential buffer circuit 600 may buffer the first input signal IN1 to generate the first output signal OUT1 and may buffer the second input signal IN2 to generate the second output signal OUT2. The second input signal IN2 may be the complementary signal of the first input signal IN1 and the second output signal OUT2 may be the complementary signal of the first output signal OUT1. The first output signal OUT1 may have an opposite logic level to the logic level of the first input signal IN1 and the second output signal OUT2 may have a logic level corresponding to the logic level of the second input signal IN2. In an embodiment, the differential buffer circuit 600 may be modified to generate the first output signal OUT1 of the same logic level as the first input signal IN1 and generate the second output signal OUT2 of the same logic level as the second input signal IN2.

The differential buffer circuit 600 may include a first buffer circuit 611 and a second buffer circuit 621. The first buffer circuit 611 may receive the first input signal IN1 and may buffer the first input signal IN1 to generate the first output signal OUT1. The first buffer circuit 611 may receive a first control signal CON1 and a second control signal CON2. Based on the first control signal CON1, the first buffer circuit 611 may reduce a swing range of the first input signal IN1 to generate a first pull-up control signal swinging within a first swing range and a first pull-down control signal swinging within a second swing range. The first swing range may be formed in a region of a lower voltage level and the second swing range may be formed in a region of a higher voltage level, the second swing range being higher than the first swing range. The first buffer circuit 611 may pull-up drive the first output signal OUT1 based on the first pull-up control signal and may pull-down drive the first output signal OUT1 based on the first pull-down control signal. Based on the second control signal CON2, the first buffer circuit 611 may further adjust the first swing range to generate the first pull-up control signal swinging within a third swing range. Based on the second control signal CON2, the first buffer circuit 611 may further adjust the second swing range to generate the first pull-down control signal swinging within a fourth swing range. The third swing range may be smaller than the first swing range and the fourth swing range may be smaller than the second swing range. At least one of the buffer circuits 100, 200 and 300 illustrated in FIGS. 1, 4A and 4B may be applied as the first buffer circuit 611.

The second buffer circuit 621 may receive the second input signal IN2 and may buffer the second input signal IN2 to generate the second output signal OUT2. The second buffer circuit 621 may receive the first control signal CON1 and the second control signal CON2. Based on the first control signal CON1, the second buffer circuit 621 may reduce the swing range of the second input signal IN2 to generate a second pull-up control signal swinging within the first swing range and a second pull-down control signal that swings within the second swing range. The second buffer circuit 621 may pull-up drive the second output signal OUT2 based on the second pull-up control signal and may pull-down drive the second output signal OUT2 based on the second pull-down control signal. Based on the second control signal CON2, the second buffer circuit 621 may additionally adjust the first swing range to generate the second pull-up control signal swinging within the third swing range. Based on the second control signal CON2, the second buffer circuit 621 may additionally adjust the second swing range to generate the second pull-down control signal swinging within the fourth swing range. At least one of the buffer circuits 100, 200 and 300 illustrated in FIGS. 1, 4A and 4B may be applied as the second buffer circuit 621. In an embodiment, when the buffer circuit 200 of FIG. 4A is applied as the first buffer circuit 611, the buffer circuit 300 of FIG. 4B may be applied as the second buffer circuit 621. Conversely, when the buffer circuit 300 of FIG. 4B is applied as the first buffer circuit 611, the buffer circuit 200 of FIG. 4A may be applied as the second buffer circuit 621.

The differential buffer circuit 600 may further include a first input buffer 612 and a second input buffer 622. The first input buffer 612 may buffer the first input signal IN1 and may provide the buffered first input signal IN1 to the first buffer circuit 611. For example, the first input buffer 612 may include an even number of inverters. The second input buffer 622 may buffer the second input signal IN2 and may provide the buffered second input signal IN2 to the second buffer circuit 621. For example, the second input buffer 622 may include an even number of inverters.

The differential buffer circuit 600 may further include at least a first inverter 613, a second inverter 623 and a first latch 631. The first inverter 613 may receive the first output signal OUT1 and may invertedly drive the first output signal OUT1. The second inverter 623 may receive the second output signal OUT2 and may invertedly drive the second output signal OUT2. The first latch 631 may be connected between output nodes of the first inverter 613 and the second inverter 623. The first latch 631 may receive the output signals of the first inverter 613 and the second inverter 623 to keep the voltage levels of the output signals of the first inverter 613 and the second inverter 623. The first latch 631 may invertedly drive the output signal of the first inverter 613 and may maintain, based on the invertedly driven signal, the voltage level of the output signal of the second inverter 623. The first latch 631 may invertedly drive the output signal of the second inverter 623 to maintain, based on the invertedly driven signal, the voltage level of the output signal of the first inverter 613.

The differential buffer circuit 600 may further include a third inverter 614, a fourth inverter 624, a second latch 632, a fifth inverter 615 and a sixth inverter 625. The third inverter 614 may receive the output signal of the first inverter 613 and may invertedly drive the output signal of the first inverter 613. The fourth inverter 624 may receive the output signal of the second inverter 623 and may invertedly drive the output signal of the second inverter 623. The second latch 632 may be connected between output nodes of the third inverter 614 and the fourth inverter 624. The second latch 632 may receive the output signals of the third inverter 614 and the fourth inverter 624 to keep the voltage levels of the output signals of the third inverter 614 and the fourth inverter 624. The second latch 632 may invertedly drive the output signal of the third inverter 614 and may maintain, based on the invertedly driven signal, the voltage level of the output signal of the fourth inverter 624. The second latch 632 may invertedly drive the output signal of the fourth inverter 624 and may maintain, based on the invertedly driven signal, the voltage level of the output signal of the third inverter 614. The fifth inverter 615 may invertedly drive the output signal of the third inverter 614 to generate a first final output signal FOUT1. The sixth inverter 625 may invertedly drive the output signal of the fourth inverter 624 to generate a second final output signal FOUT2. The number of inverters and latches included in the differential buffer circuit 600 will not be limited as illustrated in FIG. 8 and the differential buffer circuit 600 may have a greater or fewer number of inverters and latches than the ones illustrated in FIG. 8.

Figure 9:
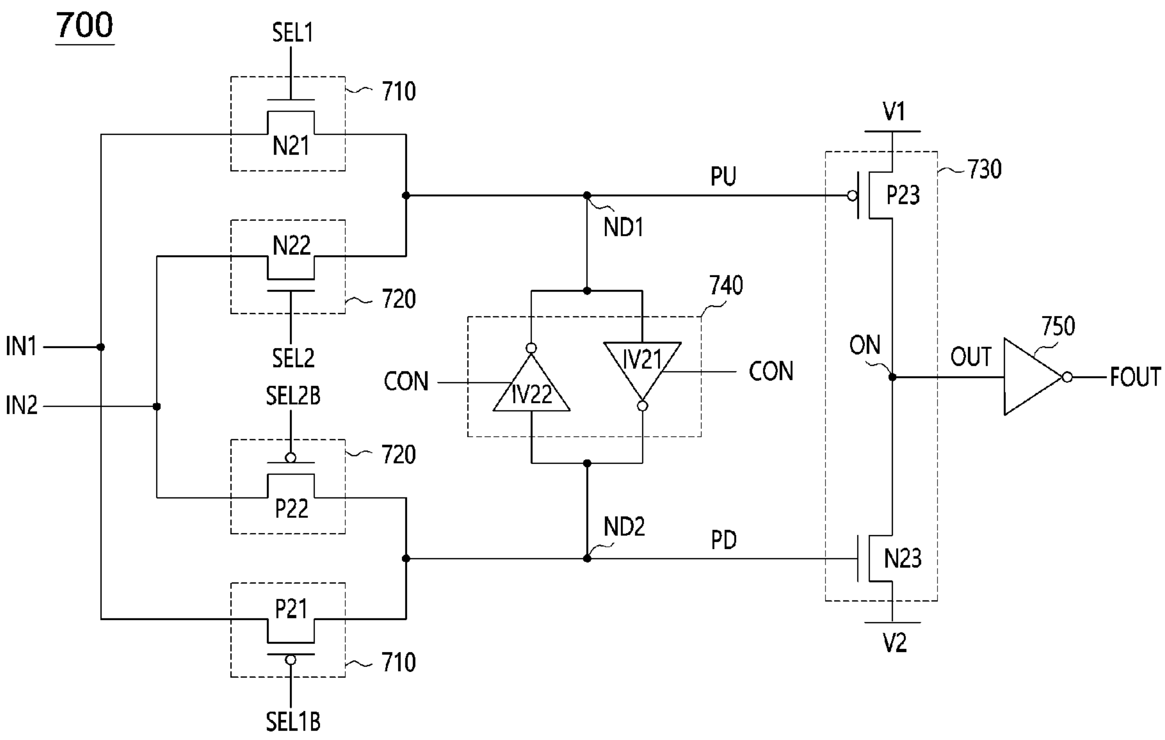
FIG. 9 is a diagram illustrating a configuration of a buffer circuit in accordance with an embodiment.

FIG. 9 is a diagram illustrating a configuration of a buffer circuit 700 in accordance with an embodiment. Referring to FIG. 9, the buffer circuit 700 may receive a first input signal IN1 and a second input signal IN2 to generate an output signal OUT. The buffer circuit 700 may receive a first selection signal SEL1 and a second selection signal SEL2. The buffer circuit 700 may generate, based on the first selection signal SEL1 and the second selection signal SEL2, the output signal OUT from one of the first input signal IN1 and the second input signal IN2. The buffer circuit 700 may change, based on the first selection signal SEL1, the voltage level of the first input signal IN1 to generate a pull-up control signal PU and a pull-down control signal PD. Based on the pull-up control signal PU and the pull-down control signal PD, the buffer circuit 700 may generate the output signal OUT. When the first selection signal SEL1 is enabled, the buffer circuit 700 may generate the pull-up control signal PU and the pull-down control signal PD, which swing within a narrower swing range than the first input signal IN1. The buffer circuit 700 may change, based on the second selection signal SEL2, the voltage level of the second input signal IN2 to generate the pull-up control signal PU and the pull-down control signal PD. When the second selection signal SEL2 is enabled, the buffer circuit 700 may generate the pull-up control signal PU and the pull-down control signal PD, which swing within a narrower swing range than the second input signal IN2. The buffer circuit 700 may be utilized as a multiplexer.

The buffer circuit 700 may include a first driving control circuit 710, a second driving control circuit 720 and a driving circuit 730. The first driving control circuit 710 may receive the first input signal IN1 and the first selection signal SEL1 to generate the pull-up control signal PU and the pull-down control signal PD. The first driving control circuit 710 may output the pull-up control signal PU through the first node ND1 and the pull-down control signal PD through the second node ND2. When the first selection signal SEL1 is enabled, the first driving control circuit 710 may change the voltage level of the first input signal IN1 to generate the pull-up control signal PU and the pull-down control signal PD. When the first selection signal SEL1 is enabled, the first driving control circuit 710 may lower the high boundary voltage level of the first input signal IN1 by a first voltage level to generate the pull-up control signal PU and may raise the low boundary voltage level of the first input signal IN1 by a second voltage level to generate the pull-down control signal PD. The first driving control circuit 710 may convert the swing range of the first input signal IN1 to generate the pull-up control signal PU swinging within a first swing range and the pull-down control signal PD swinging within a second swing range. Both the first swing range and the second swing range may be smaller than the swing range of the first input signal IN1. The first swing range may be formed in a region of a lower voltage level and the second swing range may be formed in a region of a higher voltage level than the first swing range. The first swing range may be between a voltage level, which is lower by the first voltage level than the high boundary voltage level, and the low boundary voltage level. The second swing range may be between the high boundary voltage level and a voltage level, which is higher by the second voltage level than the low boundary voltage level.

The second driving control circuit 720 may receive the second input signal IN2 and the second selection signal SEL2 to generate the pull-up control signal PU and the pull-down control signal PD. When the second selection signal SEL2 is enabled, the second driving control circuit 720 may change the voltage level of the second input signal IN2 to generate the pull-up control signal PU and the pull-down control signal PD. The second driving control circuit 720 may output the pull-up control signal PU through the first node ND1 and the pull-down control signal PD through the second node ND2. When the second selection signal SEL2 is enabled, the second driving control circuit 720 may lower the high boundary voltage level of the second input signal IN2 by the first voltage level to generate the pull-up control signal PU and may raise the low boundary voltage level of the second input signal IN2 by the second voltage level to generate the pull-down control signal PD. The second driving control circuit 720 may generate the pull-up control signal PU swinging within the first swing range and the pull-down control signal PD swinging within the second swing range.

The driving circuit 730 may receive the pull-up control signal PU and the pull-down control signal PD, which are generated from one of the first driving control circuit 710 and the second driving control circuit 720, to generate the output signal OUT. The driving circuit 730 may pull-up drive the output node ON based on the pull-up control signal PU and may pull-down drive the output node ON based on the pull-down control signal PD. The driving circuit 730 may output the output signal OUT through the output node ON. The driving circuit 730 may receive a first power voltage V1 and a second power voltage V2. The first power voltage V1 may have a higher voltage level than the second power voltage V2. For example, the first power voltage V1 may be the operating power voltage of the buffer circuit 700 and the second power voltage V2 may be the ground voltage. The driving circuit 730 may drive, based on the pull-up control signal PU, the output node ON to the voltage level of the first power voltage V1. The driving circuit 730 may drive, based on the pull-down control signal PD, the output node ON to the voltage level of the second power voltage V2.

The buffer circuit 700 may further include a voltage adjusting circuit 740. The voltage adjusting circuit 740 may receive a control signal CON and may be selectively activated based on the control signal CON. The voltage adjusting circuit 740 may be connected between the first node ND1 and the second node ND2. When the control signal CON is disabled, the voltage adjusting circuit 740 may be deactivated. When the control signal CON is enabled, the voltage adjusting circuit 740 may be activated and may additionally adjust the voltage levels of the pull-up control signal PU and the pull-down control signal PD. The voltage adjusting circuit 740 may additionally lower the voltage level of the pull-up control signal PU and may additionally raise the voltage level of the pull-down control signal PD. The voltage adjusting circuit 740 may change the voltage level of the pull-up control signal PU to a voltage level lower by a third voltage level than the high boundary voltage level. The voltage level lower by the third voltage level than the high boundary voltage level may be lower than the voltage level lower by the first voltage level than the high boundary voltage level. The voltage adjusting circuit 740 may change the voltage level of the pull-down control signal PD to a voltage level higher by a fourth voltage level than the low boundary voltage level. The voltage level higher by the fourth voltage level than the low boundary voltage level may be higher than the voltage level higher by the second voltage level than the low boundary voltage level. The voltage adjusting circuit 740 may additionally convert the swing range of the pull-up control signal PU from the first swing range to a third swing range. The third swing range may be smaller than the first swing range and may be between a voltage level, which is lower by the third voltage level than the high boundary voltage level, and the low boundary voltage level. The voltage adjusting circuit 740 may additionally convert the swing range of the pull-down control signal PD from the second swing range to a fourth swing range. The fourth swing range may be smaller than the second swing range and may be between the high boundary voltage level and a voltage level, which is higher by the fourth voltage level than the low boundary voltage level.

The buffer circuit 700 may further include an output buffer 750. The output buffer 750 may be connected to the output node ON and may receive the output signal OUT. The output buffer 750 may invertedly drive the output signal OUT to generate the final output signal FOUT. For example, the output buffer 750 may include an odd number of inverters.

The first driving control circuit 710 may include a first transistor N21 and a second transistor P21. The first transistor N21 may be an N-channel MOS transistor and the second transistor P21 may be a P-channel MOS transistor. The gate of the first transistor N21 may receive the first selection signal SEL1 and one of the source and the drain of the first transistor N21 may receive the first input signal IN1 and the other of the source and the drain of the first transistor N21 may be connected to the first node ND1. When the first selection signal SEL1 is enabled at a high logic level, the first transistor N21 may lower the high boundary voltage level of the first input signal IN1 by the threshold voltage of the first transistor N21 to generate the pull-up control signal PU having the lowered voltage level. The gate of the second transistor P21 may receive the complementary signal SEL1B of the first selection signal SEL1 and one of the source and drain of the second transistor P21 may receive the first input signal IN1 and the other of the source and drain of the second transistor P21 may be connected to the second node ND2. When the complementary signal SEL1B of the first selection signal SEL1 is enabled at a low logic level, the second transistor P21 may raise the low boundary voltage level of the first input signal IN1 by the threshold voltage of the second transistor P21 to generate the pull-down control signal PD having the raised voltage level.

The second driving control circuit 720 may include a third transistor N22 and a fourth transistor P22. The third transistor N22 may be an N-channel MOS transistor and the fourth transistor P22 may be a P-channel MOS transistor. The gate of the third transistor N22 may receive the second selection signal SEL2 and one of the source and drain of the third transistor N22 may receive the second input signal IN2 and the other of the source and drain of the third transistor N22 may be connected to the first node ND1. When the second selection signal SEL2 is enabled at a high logic level, the third transistor N22 may lower the high boundary voltage level of the second input signal IN2 by the threshold voltage of the third transistor N22 to generate the pull-up control signal PU having the lowered voltage level. The gate of the fourth transistor P22 may receive the complementary signal SEL2B of the second selection signal SEL2 and one of the source and drain of the fourth transistor P22 may receive the second input signal IN2 and the other of the source and drain of the fourth transistor P22 may be connected to the second node ND2. When the complementary signal SEL2B of the second selection signal SEL2 is enabled at a low logic level, the fourth transistor P22 may raise the low boundary voltage level of the second input signal IN2 by the threshold voltage of the fourth transistor P22 to generate the pull-down control signal PD having the raised voltage level.

The driving circuit 730 may include a fifth transistor P23 and a sixth transistor N23. The fifth transistor P23 may be a P-channel MOS transistor and the sixth transistor N23 may be an N-channel MOS transistor. The gate of the fifth transistor P23 may be connected to the first node ND1 to receive the pull-up control signal PU, the source of the fifth transistor P23 may receive the first power voltage V1 and the drain of the fifth transistor P23 may be connected to the output node ON. When the pull-up control signal PU is at a low logic level, the fifth transistor P23 may pull-up drive the output signal OUT by supplying the first power voltage V1 to the output node ON. The gate of the sixth transistor N23 may be connected to the second node ND2 to receive the pull-down control signal PD, the source of the sixth transistor N23 may receive the second power voltage V2 and the drain of the sixth transistor N23 may be connected to the output node ON. When the pull-down control signal PD is at a high logic level, the sixth transistor N23 may pull-down drive the output signal OUT by allowing current to flow from the output node ON to the node, to which the second power voltage V2 is supplied.

The voltage adjusting circuit 740 may include a first inverter IV21 and a second inverter IV22. The input node of the first inverter IV21 may be connected to the first node ND1 to receive the pull-up control signal PU. The output node of the first inverter IV21 may be connected to the second node ND2. The first inverter IV21 may receive the control signal CON and may be activated when the control signal CON is enabled. The input node of the second inverter IV22 may be connected to the output node of the first inverter IV21 and the second node ND2. The second inverter IV22 may receive the pull-down control signal PD through the second node ND2. The output node of the second inverter IV22 may be connected to the input node of the first inverter IV21 and the first node ND1. The second inverter IV22 may receive the control signal CON and may be activated when the control signal CON is enabled.

When the first selection signal SEL1 is enabled, the second driving control circuit 720 may be deactivated and the first driving control circuit 710 may generate, from the first input signal IN1, the pull-up control signal PU and the pull-down control signal PD. The first driving control circuit 710 may change the voltage level of the first input signal IN1 to generate the pull-up control signal PU swinging within the first swing range and the pull-down control signal PD swinging within the second swing range. The driving circuit 730 may pull-up drive the output node ON when the pull-up control signal PU is at a low logic level and may pull-down drive the output node ON when the pull-down control signal PD is at a high logic level, thereby generating the output signal OUT. The output buffer 750 may invertedly drive the output signal OUT to generate the final output signal FOUT of a logic level corresponding to the first input signal IN1. Because the first driving control circuit 710 generates the pull-up control signal PU having a voltage level lower than the high boundary voltage level of the first input signal IN1, the time point when the pull-up control signal PU transitions from a high logic level to a low logic level may become earlier. Because the first driving control circuit 710 generates the pull-down control signal PD having a voltage level higher than the low boundary voltage level of the first input signal IN1, the time point when the pull-down control signal PD transitions from a low logic level to a high logic level may become earlier. As the time points for the logic levels of the pull-up control signal PU and the pull-down control signal PD to transition become earlier, the output node ON may be driven more quickly and the buffer circuit 700 may reduce the time amount required to generate the output signal OUT from the first input signal IN1. When the control signal CON is enabled together, the voltage adjusting circuit 740 may be activated to additionally lower the voltage level of the pull-up control signal PU and to additionally raise the voltage level of the pull-down control signal PD. Accordingly, the time points for the logic levels of the pull-up control signal PU and the pull-down control signal PD to transition become further earlier and the operation speed of the buffer circuit 700 may become further faster.

When the second selection signal SEL2 is enabled, the first driving control circuit 710 may be deactivated and the second driving control circuit 720 may generate, from the second input signal IN2, the pull-up control signal PU and the pull-down control signal PD. The second driving control circuit 720 may change the voltage level of the second input signal IN2 to generate the pull-up control signal PU swinging within the first swing range and the pull-down control signal PD swinging within the second swing range. The driving circuit 730 may pull-up drive the output node ON when the pull-up control signal PU is at a low logic level to and may pull-down drive the output node ON when the pull-down control signal PD is at a high logic level, thereby generating the output signal OUT. The output buffer 750 may invertedly drive the output signal OUT to generate the final output signal FOUT of a logic level corresponding to the second input signal IN2. Because the second driving control circuit 720 generates the pull-up control signal PU having a voltage level lower than the high boundary voltage level of the second input signal IN2, the time point when the pull-up control signal PU transitions from a high logic level to a low logic level may become earlier. Because the second driving control circuit 720 generates the pull-down control signal PD having a voltage level higher than the low boundary voltage level of the second input signal IN2, the time point when the pull-down control signal PD transitions from a low logic level to a high logic level may become earlier. As the time points for the logic levels of the pull-up control signal PU and the pull-down control signal PD to transition become earlier, the output node ON may be driven more quickly and the buffer circuit 700 may reduce the time amount required to generate the output signal OUT from the second input signal IN2. When the control signal CON is enabled together, the voltage adjusting circuit 740 may be activated to additionally lower the voltage level of the pull-up control signal PU and to additionally raise the voltage level of the pull-down control signal PD. Accordingly, the time points for the logic levels of the pull-up control signal PU and the pull-down control signal PD to transition become further earlier and the operation speed of the buffer circuit 700 may become further faster.

While certain embodiments have been described above, it will be understood by those skilled in the art that the embodiments described are by way of example only. Accordingly, the buffer circuit, clock generating circuit, semiconductor apparatus, and semiconductor system using the same should not be limited based on the described embodiments. Rather, the buffer circuit, clock generating circuit, semiconductor apparatus, and semiconductor system using the same described herein should only be limited in light of the claims that follow when taken in conjunction with the above description and accompanying drawings.

What is claimed is:

1. A buffer circuit comprising:

a driving control circuit configured to receive an input signal swinging between a high boundary voltage level and a low boundary voltage level, configured to change a voltage level of a first node between a voltage level, which is lower by a first voltage level than the high boundary voltage level and the low boundary voltage level, and configured to change a voltage level of a second node between the high boundary voltage level and a voltage level, which is higher by a second voltage level than the low boundary voltage level; and a driving circuit configured to pull-up drive an output node based on the voltage level of the first node and configured to pull-down drive the output node based on the voltage level of the second node.

2. The buffer circuit of claim 1, wherein the driving control circuit comprises:

a pull-up control circuit configured to lower, based on a first control signal, the high boundary voltage level by the first voltage level to output a pull-up control signal through the first node; and a pull-down control circuit configured to raise, based on a complementary signal, the low boundary voltage level of the input signal by the second voltage level to output a pull-down control signal through the second node.

3. The buffer circuit of claim 2, further comprising a voltage fixing circuit configured to fix, when the first control signal is disabled, the first node to a first off-voltage and the second node to a second off-voltage.

4. The buffer circuit of claim 3, wherein the first off-voltage has a higher voltage level than the second off-voltage.

5. The buffer circuit of claim 1, further comprising a voltage adjusting circuit configured to additionally lower the voltage level of the first node and configured to additionally raise the voltage level of the second node, based on a second control signal.

6. The buffer circuit of claim 5, wherein the voltage adjusting circuit comprises a first inverter and a second inverter connected between the first node and the second node, wherein an input node of the first inverter is connected to the first node and an output node of the second inverter, and wherein an output node of the first inverter is connected to the second node and an input node of the second inverter.

7. A buffer circuit comprising:

a driving control circuit configured to receive an input signal swinging between a high boundary voltage level and a low boundary voltage level and configured to convert the swing range of the input signal to generate a pull-up control signal swinging within a first swing range and a pull-down control signal swinging within a second swing range; and a driving circuit configured to pull-up drive an output node based on the pull-up control signal and configured to pull-down drive the output node based on the pull-down control signal;

wherein the first swing range is between a voltage level, which is lower by a first voltage level than the high boundary voltage level, and the low boundary voltage level; and wherein the second swing range is between the high boundary voltage level and a voltage level, which is higher by a second voltage level than the low boundary voltage level.

8. The buffer circuit of claim 7, wherein the driving control circuit is configured to generate the pull-up control signal and the pull-down control signal from the input signal when the first control signal is enabled.

9. The buffer circuit of claim 8, further comprising a voltage fixing circuit configured to fix, when the first control signal is disabled, the first node to a first off-voltage and the second node to a second off-voltage.

10. The buffer circuit of claim 9, wherein the first off-voltage has a higher voltage level than the second off-voltage.

11. The buffer circuit of claim 7, further comprising a voltage adjusting circuit configured to additionally convert the first swing range and the second swing range based on a second control signal.

12. A buffer circuit comprising:

a driving control circuit configured to receive an input signal and configured to generate, when a first control signal is enabled, a pull-up control signal having a voltage level lower than a high boundary voltage level of the input signal and a pull-down control signal having a voltage level higher than a low boundary voltage level of the input signal;

a driving circuit configured to pull-up drive an output node based on the pull-up control signal and configured to pull-down drive the output node based on the pull-down control signal; and a voltage adjusting circuit configured to additionally lower the voltage level of the pull-up control signal and configured to additionally raise the voltage level of the pull-down control signal based on a second control signal.

13. The buffer circuit of claim 12, further comprising a voltage fixing circuit configured to fix, when the first control signal is disabled, the pull-up control signal to a first off-voltage and the pull-down control signal to a second off-voltage.

14. The buffer circuit of claim 13, wherein the first off-voltage has a higher voltage level than the second off-voltage.

* * * * *